US010982323B2

(12) United States Patent
Maehira et al.

(10) Patent No.: US 10,982,323 B2
(45) Date of Patent: Apr. 20, 2021

(54) CONDUCTIVE THIN FILM MANUFACTURING METHOD

(71) Applicant: ULVAC, INC., Chigasaki (JP)

(72) Inventors: Ken Maehira, Chigasaki (JP); Koh Fuwa, Chigasaki (JP); Tomoko Kittaka, Chigasaki (JP); Tetsuhiro Ohno, Chigasaki (JP); Hirotoshi Sakaue, Chigasaki (JP)

(73) Assignee: ULV AC, INC., Chigasaki (JP)

( * ) Notice: Subject to any disclaimer, the term of this patent is extended or adjusted under 35 U.S.C. 154(b) by 0 days.

(21) Appl. No.: 16/853,141

(22) Filed: Apr. 20, 2020

(65) Prior Publication Data

US 2020/0248301 A1 Aug. 6, 2020

Related U.S. Application Data

(63) Continuation of application No. PCT/JP2018/041306, filed on Nov. 7, 2018.

(30) Foreign Application Priority Data

Nov. 10, 2017 (JP) .............................. JP2017-217198

(51) Int. Cl.
*H01J 37/32* (2006.01)
*C23C 14/50* (2006.01)
(Continued)

(52) U.S. Cl.
CPC ............ *C23C 14/505* (2013.01); *C23C 14/34* (2013.01); *H01J 37/32724* (2013.01); *H02N 13/00* (2013.01)

(58) Field of Classification Search
None
See application file for complete search history.

(56) References Cited

U.S. PATENT DOCUMENTS 5,753,092 A * 5/1998 Hollars .................. C23C 14/50
118/719
6,088,213 A * 7/2000 Herchen ............. H01L 21/6831
257/714
(Continued)

FOREIGN PATENT DOCUMENTS

JP 2003-037159 A 2/2003
JP 2004-031502 A 1/2004
(Continued)

OTHER PUBLICATIONS

Feb. 5, 2019 International Search Report issued in International Patent Application No. PCT/JP2018/041306.
(Continued)

*Primary Examiner* — Jason Berman
(74) *Attorney, Agent, or Firm* — Oliff PLC

(57) ABSTRACT

A first voltage is applied to a first positive electrode and a first negative electrode of an attraction plate in a lying posture to attract a dielectric object to be attracted on the attraction plate. The attraction plate is turned to a stand posture while attracting the dielectric object by a gradient force, and a conductive thin film is grown while applying a second voltage to a second positive electrode and a second negative electrode to generate an electrostatic force. Since the object is continuously attracted, the attraction plate will not detach. After having started attraction by electrostatic force, introduction of heat medium gas between the object and the attraction plate allows for temperature control of the object.

8 Claims, 14 Drawing Sheets

(51) Int. Cl.
*C23C 14/34* (2006.01)
*H02N 13/00* (2006.01)

(56) References Cited

U.S. PATENT DOCUMENTS

| | | | |
|---|---|---|---|
| 2011/0132259 | A1 | 6/2011 | Satou et al. |
| 2014/0231389 | A1* | 8/2014 | Nagami ............ H01J 37/32944 216/67 |
| 2017/0352540 | A1* | 12/2017 | Watanabe ............. C23C 14/566 |

FOREIGN PATENT DOCUMENTS

| | | |
|---|---|---|
| JP | 2008-153543 A | 7/2008 |
| JP | 2012-044200 A | 3/2012 |
| WO | 2010/024146 A1 | 3/2010 |
| WO | 2016/167233 A1 | 10/2016 |

OTHER PUBLICATIONS

Sep. 1, 2020 Office Action issued in Korean Patent Application No. 10-2019-7029724.

\* cited by examiner

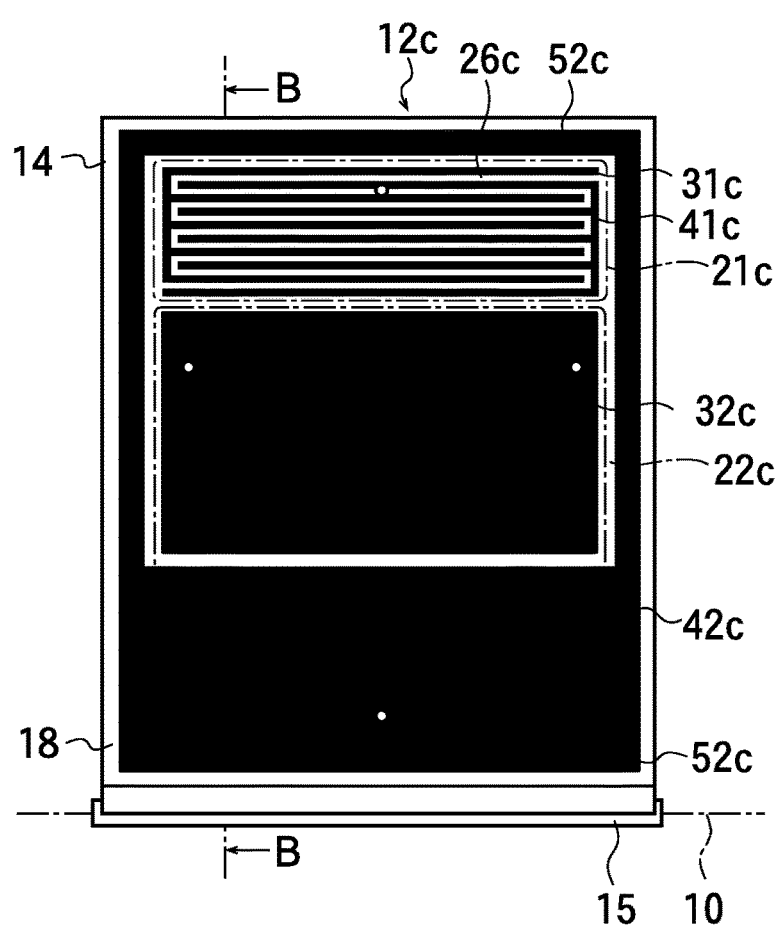
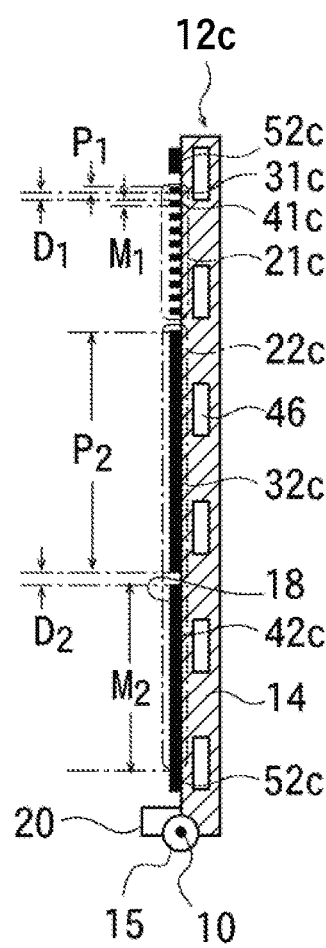
Fig. 9A
Fig. 9B

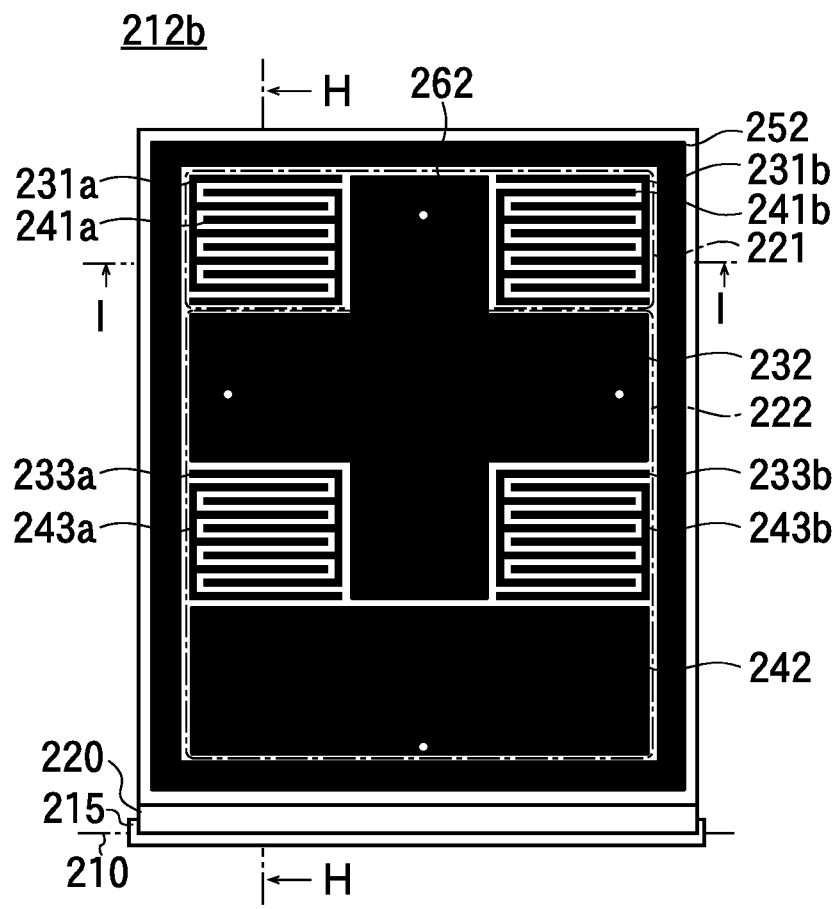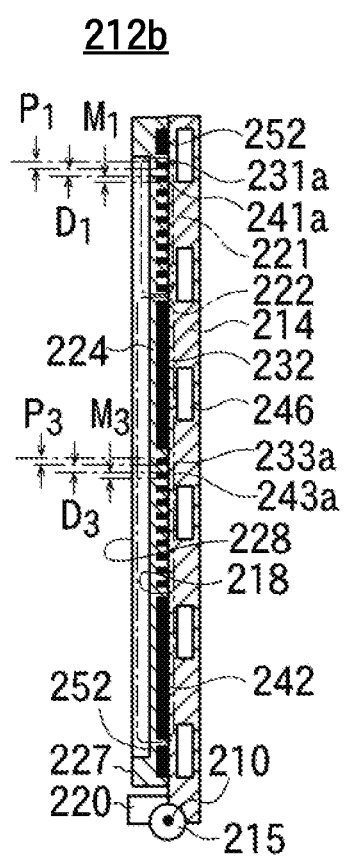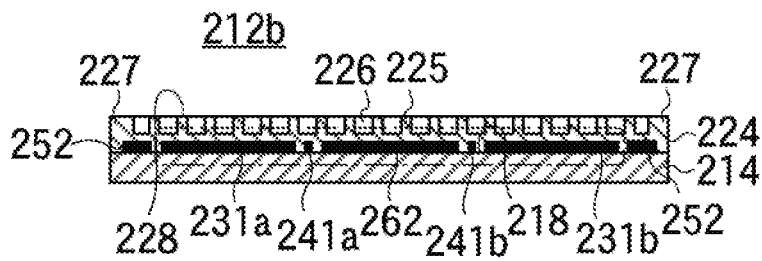
Fig. 19A
Fig. 19B
Fig. 19C

CONDUCTIVE THIN FILM MANUFACTURING METHOD

BACKGROUND

The present disclosure generally relates to a vacuum apparatus, and particularly relates to an attraction apparatus used for a vacuum apparatus.

There is known a technique in which an attraction device is used for attracting a large-sized substrate horizontally by placing an electrode of the attraction apparatus in contact with the back surface of the large-sized substrate, and applying a high voltage to the electrode to attract the large-sized substrate in order to form a thin film on the surface of the large-sized substrate in a high thermal conductivity state. An attraction apparatus which generates electrostatic force (also referred to as electrostatic attraction force) is used for attracting the large-sized substrate having a conductive thin film formed on the surface thereof, and an electrostatic attraction apparatus which generates gradient force is used for attracting the large-sized substrate made of a dielectric.

Along with the upsizing of display devices, such as, liquid crystal display devices, substrates of the display devices are becoming larger year by year, in the result, excessively large footprints of vacuum apparatuses used for growing a thin film on horizontally placed substrates, so that in recent years, a vacuum apparatus is used of which a horizontally placed substrate is attracted by an attraction apparatus in vacuum environment, then, the substrate is made stand by standing the attraction apparatus, and a thin film is grown on the substrate.

SUMMARY

However, there is observed a phenomenon such that growing a metal thin film while attracting a dielectric substrate using gradient force, it results in weakened gradient force, and therefore, a risk is indicated that the dielectric substrate stood by the gradient force may peel from the attraction apparatus, or a part of the dielectric substrate may peel due to buckling caused by its own weight.

Therefore, although there is a technique that, for example, the back surface of a large-sized substrate is adhered to a holding plate using adhesive, and erects the large-sized substrate to form a thin film on the surface thereof, there is a problem that using adhesive causes a low upper limit temperature of the large-sized substrate, and fails to increase the growth speed of the thin film.

In recent years, there are increasing numbers of large-sized dielectric substrates which cannot stand by themselves and may suffer from cracking or chipping when they come off from the attraction apparatus, and thus, there is a need for a technique that holds the backside of a large-sized substrate vertically.

The present disclosure describes a technique for solving the problems of the conventional techniques discussed above, and the problem to be solved is providing a technique that allows for erecting a substrate and forming a conductive thin film thereon.

An attraction principle of the present disclosure will be discussed.

FIG. 6A illustrates a case where electric force lines 100a formed in a significantly curved manner with a high density between narrow-width and narrowly-spaced-apart positive and negative electrodes 131 and 141 are formed on an attraction plate 114a, and FIG. 6B illustrates a case where electric force lines 100b formed with a lower density and a smaller curvature between wide-width and widely-spaced-apart positive and negative electrodes 132 and 142 are formed on an attraction plate 114b.

Because the density of electric force lines between the positive and negative electrodes 131 and 141 is high and significantly curved, a dielectric object to be attracted 108 is attracted by the gradient force generated on the narrow-width and narrowly-spaced-apart positive and negative electrodes 131 and 141.

In contrast, FIG. 6C illustrates a case where the dielectric object to be attracted 108 having a conductive thin film 109 formed thereon is provided on the positive and negative electrodes 131 and 141 of FIG. 6A, and FIG. 6D illustrates a case where the dielectric object to be attracted 108 having the conductive thin film 109 formed thereon is provided on the positive and negative electrodes 132 and 142 of FIG. 6B.

Because the total number of the electric force lines 100a formed between the narrow-width and narrowly-spaced-apart positive and negative electrodes 131 and 141 of FIG. 6C is larger than the total number of the electric force lines 100b formed between the wide-width and widely-spaced-apart positive and negative electrodes 132 and 142 of FIG. 6D, the positive and negative electrodes 132 and 142 of FIG. 6D have a larger electrode area size, and thus, it can be seen that the number of electric force lines 101b formed between the pair of the wide-width and widely-spaced-apart positive and negative electrodes 132 and 142, and the conductive thin film 109 of FIG. 6D turns out to be larger than the number of electric force lines 101a formed between the pair of the narrow-width and narrowly-spaced-apart positive and negative electrodes 131 and 141, and the conductive thin film 109 of FIG. 6C, whereby the dielectric object to be attracted 108 having the conductive thin film 109 formed thereon is attracted by electrostatic force between the positive and negative electrodes 132 and 142 of FIG. 6D, which is the dominant force.

The present embodiment, which has been made to solve the aforementioned problems, is a vacuum apparatus including a vacuum chamber, and an attraction apparatus provided inside the vacuum chamber. The attraction apparatus includes an attraction plate, an attraction surface which is one surface of the attraction plate, a first positive electrode and a first negative electrode arranged apart from each other in a first region provided on the attraction surface, and a second positive electrode and a second negative electrode arranged apart from each other in a second region provided on a place separated from the first region on the attraction surface. The vacuum apparatus further includes a rotating device configured to rotate the attraction apparatus to place the attraction apparatus in standing as a stand posture and lying as a lying posture, a thin film forming device configured to form a conductive thin film on an object to be attracted placed in a stand posture together with the attraction apparatus, and an attraction power source configured to apply a first attraction voltage between the first positive electrode and the first negative electrode so as to attract a dielectric of the object to be attracted arranged on the attraction apparatus by gradient force, and to apply a second attraction voltage which is lower than the first attraction voltage between the second positive electrode and the second negative electrode so as to attract the conductive thin film formed on the object to be attracted by electrostatic attraction force, wherein the first region is located above the second region when the attraction apparatus is placed in the stand posture, and wherein the attraction power source and the rotating device are capable of turning the attraction apparatus from the lying posture to the stand posture, while the first attraction voltage is applied between the first positive electrode and the first negative electrode.

The present embodiment provides the vacuum apparatus, wherein the attraction apparatus has a rotating shaft provided in parallel to one edge of the attraction plate, and wherein the rotating device rotates the attraction apparatus about the rotating shaft.

The present embodiment provides the vacuum apparatus, wherein a side surface of the first positive electrode and a side surface of the first negative electrode are spaced apart by a first distance, and wherein a side surface of the second positive electrode and a side surface of the second negative electrode are spaced apart by a second distance which is longer than the first distance.

The present embodiment provides the vacuum apparatus, wherein a width of the first positive electrode and a width of the first negative electrode are formed to be narrower than a width of the second positive electrode and a width of the second negative electrode.

The present embodiment provides the vacuum apparatus, wherein the thin film forming device includes a conductive sputtering target facing the object to be attracted placed in a stand posture together with the attraction apparatus, and wherein sputtering of the sputtering target causes growing of the conductive thin film.

The present embodiment provides the vacuum apparatus further including a ring-shaped annular electrode surrounding the first positive electrode, the first negative electrode, the second positive electrode and the second negative electrode, and wherein the annular electrode is applied with a voltage of a same value as the voltage applied to either the second positive electrode or the second negative electrode.

The present embodiment provides the vacuum apparatus having a heat medium gas supply device configured to supply heat medium gas to the attraction apparatus, the vacuum apparatus further includes a protection film exposed on the surface of the attraction apparatus, wherein the protection film is provided on the attraction surface of the attraction apparatus, and the protection film includes a gas groove made of a groove, a ring-shaped ridge having a height of the upper end being raised higher than the bottom surface of the gas groove, wherein the ring shaped ridge is formed at a position right above the annular electrode, a support protrusion having the upper end being raised higher than the bottom surface of the gas groove, wherein the support protrusion is located between the gas grooves, and a gas-introducing hole connected to the gas groove to introduce the heat medium gas into the gas groove, and a detection device configured to detect the heat medium gas is provided in the vacuum chamber.

The present embodiment provides the vacuum apparatus further including an auxiliary electrode to be applied with a same voltage as the voltage applied to either the second positive electrode or the second negative electrode, wherein the auxiliary electrode is provided in the first region.

The present embodiment provides the vacuum apparatus, wherein the auxiliary electrode is surrounded by the annular electrode.

The present embodiment provides the vacuum apparatus, further including, in the second region, a third positive electrode and a third negative electrode whose side surfaces are spaced apart by the first distance, and wherein the attraction power source applies a third attraction voltage of a same value as the first attraction voltage, between the third positive electrode and the third negative electrode.

The present embodiment provides the vacuum apparatus, wherein the third positive electrode and the third negative electrode are surrounded by the annular electrode.

The present embodiment provides an attraction apparatus including an attraction plate, an attraction surface which is one surface of the attraction plate, and a first region and a second region provided on the attraction surface, wherein the first region is located at an upper position, and the second region is located below the first region when the attraction plate is placed in a stand posture, are provided on the attraction surface, wherein in the first region, a first positive electrode and a first negative electrode are arranged apart from each other, wherein in the second region, a second positive electrode and a second negative electrode are arranged apart from each other, wherein a first attraction voltage for attracting a dielectric of an object to be attracted arranged over the first region and the second region by gradient force is applied between the first positive electrode and the first negative electrode to attract, and a second attraction voltage which is lower than the first attraction voltage, and for attracting the conductive thin film formed on the object to be attracted by electrostatic attraction force is applied between the second positive electrode and the second negative electrode.

The present embodiment provides the attraction apparatus further including a rotating shaft provided in parallel to one edge of the attraction plate, and wherein the attraction apparatus is configured to be rotated about the rotating shaft, and paused in standing as a stand posture, and lying as a lying posture.

The present embodiment provides the attraction apparatus, wherein a side surface of the first positive electrode and a side surface of the first negative electrode are spaced apart with a first distance, and wherein a side surface of the second positive electrode and a side surface of the second negative electrode are spaced apart with a second distance which is longer than the first distance.

The present embodiment provides the attraction apparatus, further including a ring-shaped annular electrode surrounding the first positive electrode, the first negative electrode, the second positive electrode, and the second negative electrode, wherein the annular electrode is applied with a voltage of a same value as the voltage applied to either the second positive electrode or the second negative electrode.

The present embodiment provides the attraction apparatus, wherein a protection film exposed on the surface of the attraction apparatus is provided on the attraction surface of the attraction apparatus.

The present embodiment provides the attraction apparatus, the protection film further including a gas groove made of a groove, a ring-shaped ridge which has an upper end thereof being raised higher than the bottom surface of the gas groove, and formed at a position right above the annular electrode, a support protrusion which has an upper end thereof being raised higher than the bottom surface of the gas groove, and located between the gas grooves, and a gas-introducing hole connected to the gas groove to introduce the heat medium gas into the gas groove.

The present embodiment provides the attraction apparatus, further including an auxiliary electrode to which a same voltage as the voltage applied to either the second positive electrode or the second negative electrode is applied, and wherein the auxiliary electrode is provided in the first region.

The present embodiment provides the attraction apparatus, wherein the auxiliary electrode is surrounded by the annular electrode.

The present embodiment provides the attraction apparatus further including a third positive electrode and a third negative electrode whose side surfaces are spaced apart with a first distance, and the third positive electrode and the third negative electrode are provided in the second region.

The present embodiment provides the attraction apparatus, wherein the third positive electrode and the third negative electrode are surrounded by the annular electrode.

The present embodiment provides a method of manufacturing a conductive thin film, the method comprising arranging, in a vacuum environment, a dielectric object to be attracted on an attraction apparatus in a lying posture; applying a first attraction voltage that generates gradient force between a first positive electrode and a first negative electrode provided in a first region of an attraction plate of the attraction apparatus; rotating the attraction apparatus while attracting dielectric of the object so as to place the object and the attraction apparatus together in a stand posture; applying a second attraction voltage that generates electrostatic force between a second positive electrode and a second negative electrode provided in a second region located below the first region; and growing a conductive thin film on a surface of the object via attraction of the attraction apparatus.

The present embodiment provides the conductive thin film manufacturing method, further including, when the attraction apparatus and the object are in the stand posture, applying, between the first positive electrode and the first negative electrode of the attraction apparatus, a second attraction voltage that generates electrostatic attraction force between the conductive thin film and the second positive electrode and between the conductive thin film and the second negative electrode; attracting the conductive thin film by the second positive electrode and the second negative electrode; and subsequently reducing the voltage applied between the first positive electrode and the first negative electrode.

The present embodiment provides the conductive thin film manufacturing method, further including, after reducing the voltage applied between the first positive electrode and the first negative electrode, introducing, between the object and the attraction apparatus respectively placed in the stand posture, heat medium gas from a gas-introducing hole of the attraction apparatus; and detecting the heat medium gas in the vacuum environment.

The present embodiment provides the conductive thin film manufacturing method, further including, when the object is placed in the stand posture, sputtering a sputtering target facing the object so as to grow the conductive thin film.

The present embodiment provides the conductive thin film manufacturing method, wherein after starting the introduction of the heat medium gas from the gas-introducing hole, setting electric power supplied to the sputtering target to be larger than electric power supplied to the sputtering target before starting the introduction of the heat medium gas from the gas-introducing hole.

The present embodiment provides the conductive thin film manufacturing method, further including applying a voltage of a same value as that of either the second positive electrode or the second negative electrode to an annular electrode surrounding the first positive electrode, the first negative electrode, the second positive electrode, and the second negative electrode; attracting the conductive thin film by the annular electrode via electrostatic force; and introducing the heat medium gas from the gas-introducing hole, the gas-introducing hole being provided in a region surrounded by a ring-shaped ridge of the annular electrode, while pressing the object against the ring-shaped ridge.

The present embodiment provides the conductive thin film manufacturing method, further including applying the first attraction voltage between a third positive electrode and a third negative electrode provided in the second region, when applying the first attraction voltage between the first positive electrode and the first negative electrode.

The present embodiment provides the conductive thin film manufacturing method, further including applying the second attraction voltage between an auxiliary electrode provided in the first region and either the second positive electrode or the second negative electrode, when applying the second attraction voltage to the second positive electrode and the second negative electrode.

Because it is possible to keep attracting the object to be attracted even after the conductive thin film has grown on the object to be attracted, neither chipping nor cracking occurs on the object to be attracted.

Because no device comes into contact with the surface of the object to be attracted, the surface is contamination-free.

Because the heat medium gas is introduced between the object to be attracted and the attraction apparatus, the thermal conductivity increases.

Because the second attraction voltage is applied between the annular electrode surrounding the first and the second positive and negative electrodes, and the second positive electrode or the second negative electrode when introducing the gas, and the object to be attracted is pressed against the ring-shaped ridge on the annular electrode, the amount of outflow of the heat medium gas introduced between the object to be attracted and attraction apparatus is reduced.

Increase of the thermal conductivity by introducing the heat medium gas allows for increasing the electric power for sputtering the sputtering target larger than before introducing the heat medium gas.

Because the heat medium gas is introduced after having prevented application of a high voltage between the first positive and negative electrodes, and between the third positive and negative electrodes, occurrence of electric discharge is prevented.

Since the voltage applied to the first positive and negative electrodes is reduced after having generated the electrostatic force between the pair of the second positive and negative electrodes, and the conductive thin film, the conductive thin film is attracted by the electrostatic force before the gradient force disappears, so that falling of the object to be attracted is prevented.

BRIEF DESCRIPTION OF DRAWINGS

FIG. 9A is a plan view of an exemplary attraction apparatus having first positive and negative electrodes whose interval is not surrounded by a first positive or negative electrode;

FIG. 9B is a cross-sectional view taken along line B-B of FIG. 9A;

FIG. 19A is a plan view showing an electrode of an attraction apparatus having the annular electrode and the second positive and negative electrodes separated therein;

FIG. 19B is a cross-sectional view taken along line H-H of FIG. 19A; and

FIG. 19C is a cross-sectional view taken along line I-I of FIG. 19A.

DESCRIPTION OF EMBODIMENTS

It is an object of the present disclosure, which has been made to solve the shortcomings of conventional techniques discussed above, to provide a technique that allows for stably growing a conductive film on a dielectric substrate.

Figure 1:
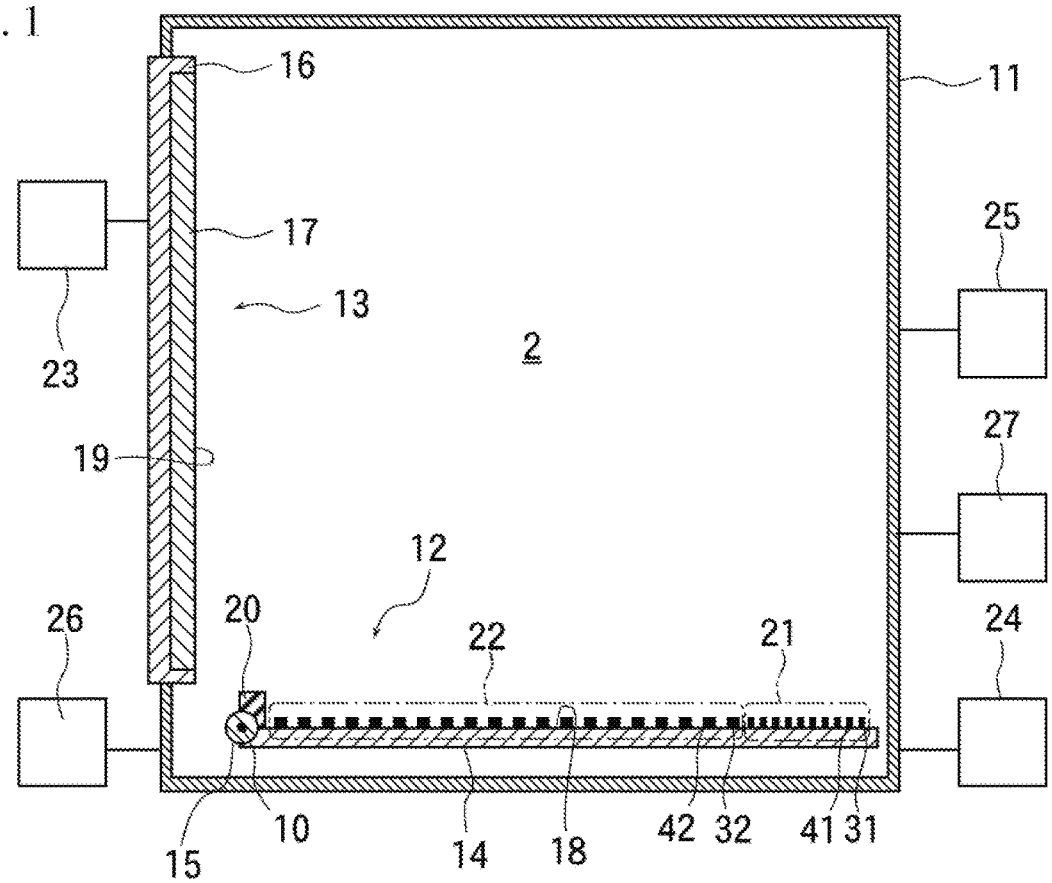
FIG. 1 is an explanatory diagram of an attraction plate placed in a lying posture.

The reference numeral 2 of FIG. 1 indicates a vacuum apparatus of the present disclosure, which includes a vacuum chamber 11, an attraction apparatus 12, and a target device 13.

External to the vacuum chamber 11, there are provided a rotating device 26, such as, a motor, and a sputter power source 23.

The target device 13 has a sputtering target 17 to be sputtered and a cathode electrode 16 to which the sputtering target 17 is provided, and the cathode electrode 16 is connected to the sputter power source 23.

The attraction apparatus 12 has a rectangular or square-shaped attraction plate 14 and a rod-shaped rotating shaft 15 provided on one edge of the attraction plate 14, and the rotating shaft 15, which is connected to the rotating device 26, rotates when the rotating device 26 operates. The rotation causes the attraction apparatus 12 to rotate about an axis of rotation 10 in a manner such that centered at the axis of rotation 10 passing through the section center of the rotating shaft 15, and being in parallel to the longitudinal direction of the rotating shaft 15.

The target device 13 is provided on a side wall of the vacuum chamber 11 such that the surface of the sputtering target 17 to be sputtered is generally vertical. The reference numeral 19 indicates a sputter surface which is the surface subjected to be sputtered. The sputtering target 17 is made of a conductive material, which is here metal molded into a plate-like shape, with the metal contained in the sputtering target 17 being exposed on the sputter surface 19.

When the attraction apparatus 12 rotates, the attraction plate 14 is configured to be capable of pausing in at least either a lying posture in which the attraction surface 18 which is one of the surfaces of the attraction plate 14 is placed generally horizontally in a manner facing upward, or a stand posture in which the attraction surface 18 is placed generally vertically in a manner facing the sputtering target 17.

Figure 2:
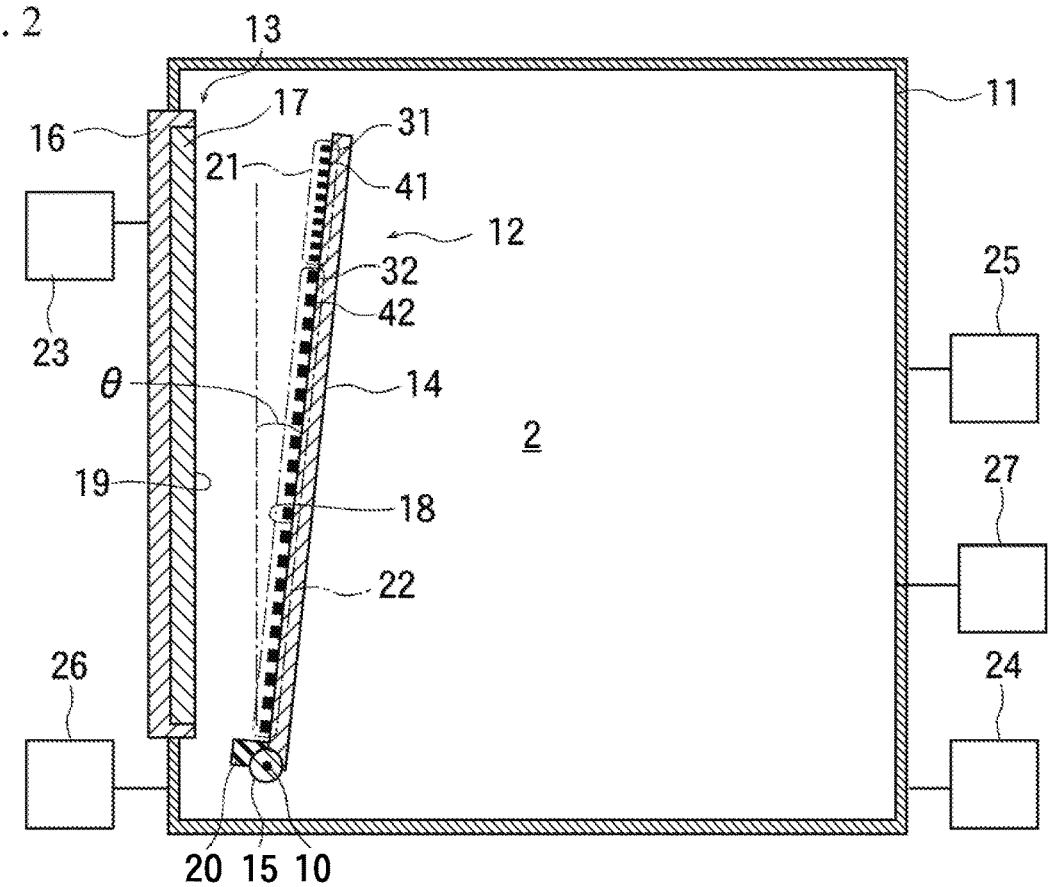
FIG. 2 is an explanatory diagram of an attraction plate placed in a stand posture.

FIG. 1 shows the attraction plate 14 placed in a lying posture, and FIG. 2 shows the attraction plate 14 placed in a stand posture. A posture at which the attraction surface 18 is inclined by an angle θ which is less than ±10 degrees from the vertical state is also included in a stand posture. In addition, a posture at which the attraction surface 18 is inclined by a predetermined angle from the horizontal posture is also regarded as a lying posture.

Figure 5B:
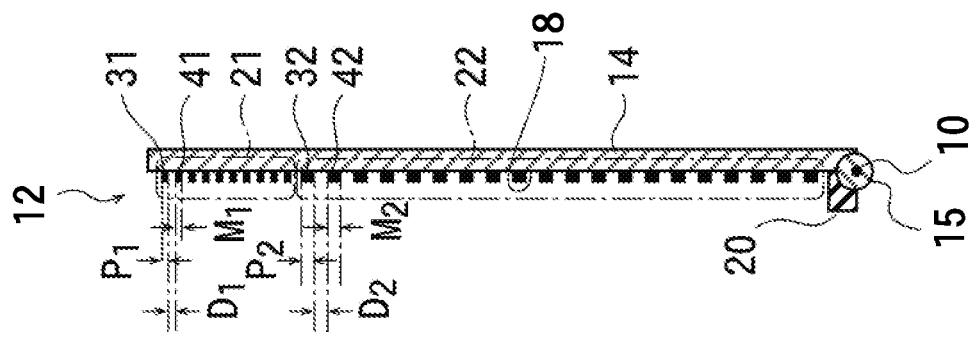
FIG. 5B is a cross-sectional view taken along line A-A of FIG. 5A.
Figure 5A:
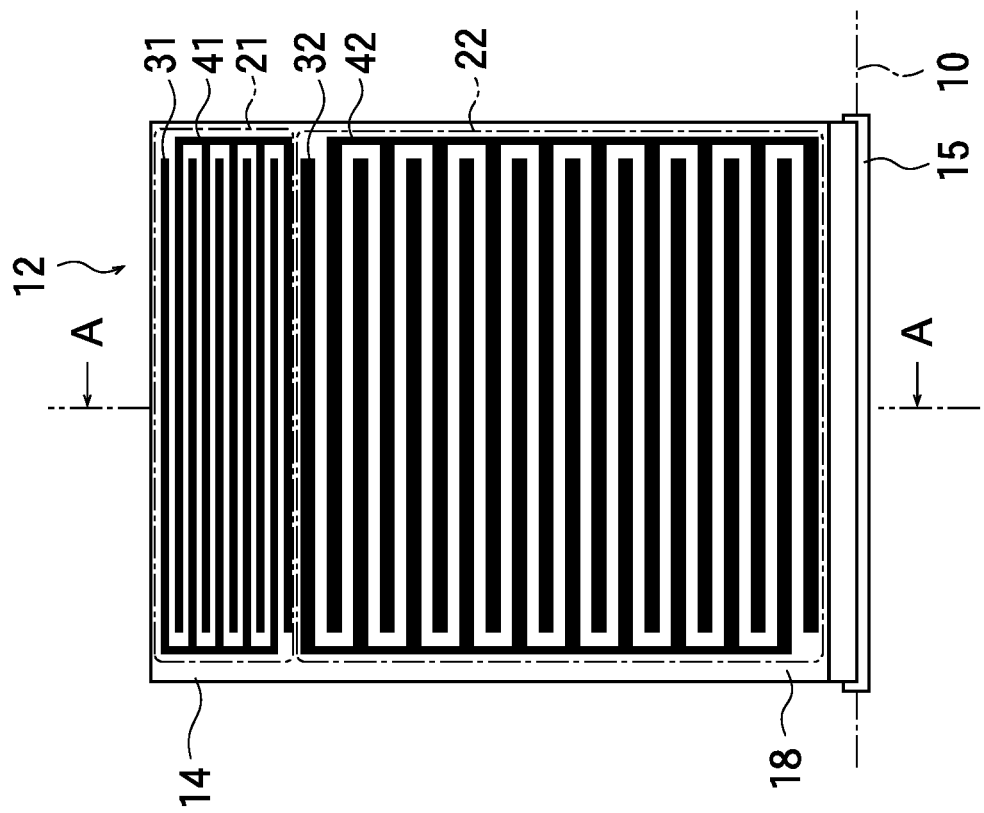
FIG. 5A is an explanatory diagram of an electrode pattern of the surface of the attraction plate.
Figure 6A:
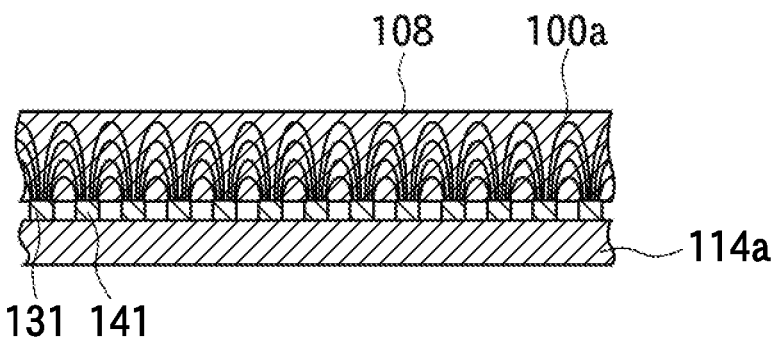
FIGS. 6A, 6B, 6C and 6D are diagrams for comparing electrodes that attracts by electrostatic force and electrodes that attracts by gradient force.
Figure 6B:
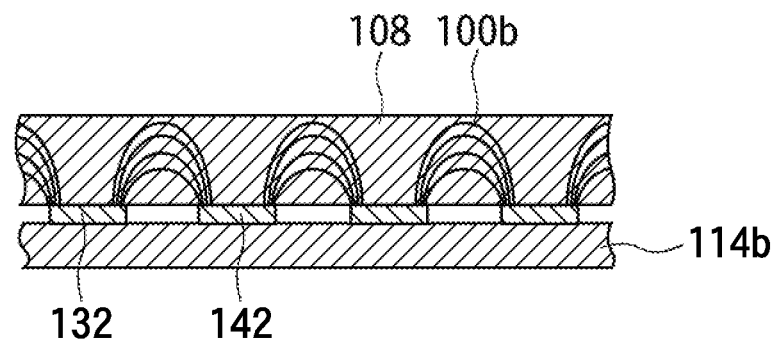
Figure 6C:
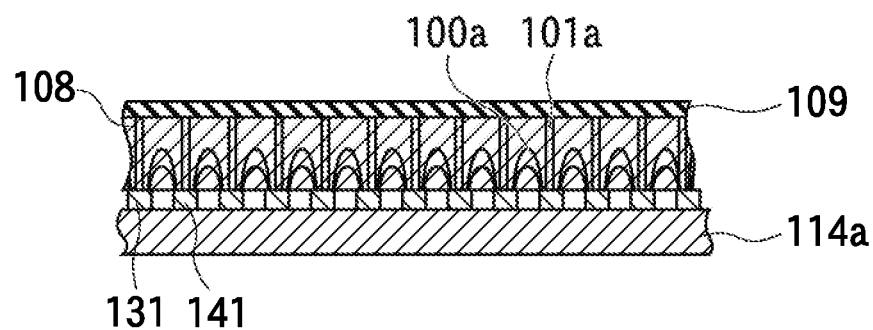
Figure 6D:
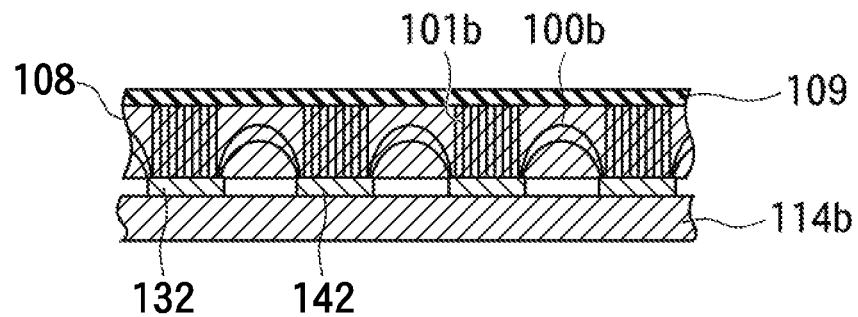

FIG. 5A is a plan view of the attraction surface 18, in which the attraction surface 18 is provided thereon a first region 21 and a second region 22 spaced apart from the first region 21.

FIG. 5A is a plan view of the attraction surface 18, and FIG. 5B is a cross-sectional view taken along line A-A thereof. As shown in FIGS. 5A and 5B, a first positive electrode 31 and a first negative electrode 41 are provided in the first region 21, and a second positive electrode 32 and a second negative electrode 42 are provided in the second region 22.

The first positive electrodes 31, the first negative electrodes 41, the second positive electrodes 32, and the second negative electrodes 42 are formed of a plurality of elongated conductive members arranged in a comb-teeth manner on the attraction surface 18, with the first positive electrodes 31 and the first negative electrodes 41 are alternately provided, and the second positive electrodes 32 and the second negative electrodes 42 being alternately provided.

The side surface of the first positive electrode 31 and the side surface of the first negative electrode 41 are provided in parallel to, and spaced apart from each other by a first distance $D_1$. Similarly, the side surface of the second positive electrode 32 and the side surface of the second negative electrode 42 are provided spaced apart from each other by a second distance $D_2$ which is longer than the first distance $D_1$.

A width $P_1$ of the first positive electrode 31 and a width $M_1$ of the first negative electrode 41 are formed to be shorter than a width $P_2$ of the second positive electrode 32, and shorter than a width $M_2$ of the second negative electrode 42.

An attraction power source 24 is provided outside of the vacuum chamber 11. The vacuum chamber 11 is connected to ground potential, and a positive voltage of a same magnitude being applied to a plurality of the first positive electrodes 31 by the attraction power source 24. Furthermore, in a case where a plurality of the second positive electrodes 32 are provided, they are applied with positive voltages of a same magnitude but of a smaller value than the value applied to the first positive electrode 31. In the following description, having a same absolute value and same polarity is expressed as having a "same value".

Similarly, the plurality of the first negative electrodes 41 are to be applied with a negative voltage of a same magnitude, and the second negative electrodes 42 are to be applied with a negative voltage of a same magnitude and having an absolute value which is smaller than the absolute value of the negative voltage applied to the first negative electrodes 41.

A first attraction voltage which is a voltage between the first positive electrode 31 and the first negative electrode 41 based on the first negative electrode 41 is set to a value larger than a second attraction voltage, which is a voltage between the second positive electrode 32 and the second negative electrode 42 based on the second negative electrode 42.

According to the magnitude of the attraction voltage and the measurement of the first and the second distances $D_1$ and $D_2$, the curvature of the electric force lines formed between the first positive electrode 31 and the first negative electrode 41 is larger than the curvature of the electric force lines formed between the second positive electrode 32 and the second negative electrode 42, whereby a non-uniform electric field is formed between the first positive electrode 31 and the first negative electrode 41. Therefore, comparing when the dielectric is provided among the electric force lines formed between the first positive electrode 31 and the first negative electrode 41, and when the dielectric is provided among the electric force lines formed between the second positive electrode 32 and the second negative electrode 42, larger gradient force is generated and therefore attraction force is stronger when the dielectric is provided among the electric force lines formed between the first positive electrode 31 and the first negative electrode 41.

Next, on the first positive and negative electrodes 31 and 41, and the second positive and negative electrodes 32 and 42, the object to be attracted can be provided, and among the surfaces of the first positive and negative electrodes 31 and 41, and the surfaces of the second positive and negative electrodes 32 and 42, assuming a surface positioned where the slimline first positive and negative electrodes 31 and 41 which are adjacent each other face the object to be attracted, and a surface positioned where the slimline second positive and negative electrodes 32 and 42 which are adjacent each other face the object to be attracted as attraction surfaces, the area size of the electrode surface per unit area size in the second region 22 (total value of the area size of the electrode surface of the second positive electrode and the area size of the electrode surface of the second negative electrode per unit area size) is made larger than the area size of the electrode surface per unit area size in the first region 21 (total value of the area size of the electrode surface of the first positive electrode and the area size of the electrode surface of the first negative electrode per unit area size), and thus, the number of electric force lines formed between the pair of the second positive and negative electrodes 32 and 42 and the conductive thin film is larger than the number of electric force lines formed between the pair of the first positive and negative electrodes 31 and 41, and the conductive thin film when the conductive thin film is formed on the object to be attracted arranged on the first positive and negative electrodes 31 and 41 and the second positive and negative electrodes 32 and 42, whereby the attraction force due to the electrostatic force (also referred to as coulomb force) generated between the second positive and negative electrodes 32 and 42 and the object to be attracted is stronger than the attraction force due to the electrostatic force generated between the first positive and negative electrodes 31 and 41 and the object to be attracted.

A vacuum-exhausting device 27 connected to the vacuum chamber 11, and the interior of the vacuum chamber 11 is vacuum-exhausted by the vacuum-exhausting device 27 to form vacuum environment.

Figure 3:
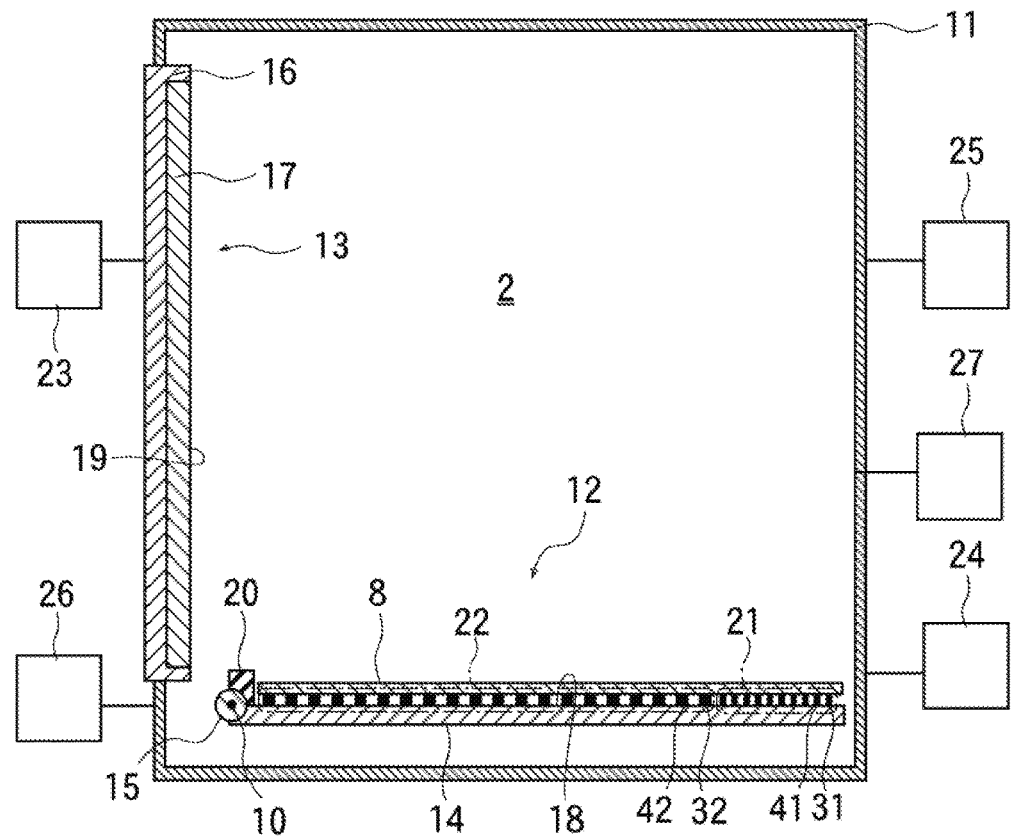
FIG. 3 is an explanatory diagram of an object to be attracted attracted onto an attraction plate placed in a lying posture.

In FIG. 3, an object to be attracted 8 made of a dielectric plate is provided over the first positive and negative electrodes 31 and 41, and the second positive and negative electrodes 32 and 42 of the attraction plate 14 placed in a lying posture, while maintaining the vacuum environment in the vacuum chamber 11. The object to be attracted 8 is made of a glass substrate, for example.

When a conductive thin film is formed on the surface of the object to be attracted 8, first, the first attraction voltage is applied between the first positive and negative electrodes 31 and 41, and the second attraction voltage is applied between the second positive and negative electrodes 32 and 42, then, large gradient force is generated between the first positive and negative electrodes 31 and 41, whereby the object to be attracted 8 is attracted onto the first positive and negative electrodes 31 and 41.

The attraction apparatus 12 is rotated about 90 degrees by the rotating device 26 in the aforementioned state, whereby the attraction plate 14 is turned from a lying posture to a stand posture. On this occasion, because the first region 21 is located above the second region 22, the object to be attracted 8 is suspended by the first positive and negative electrodes 31 and 41 in the first region 21 while riding on the attraction plate 14, whereby the posture of the attraction plate 14 is turned from a lying posture to a stand posture without the object to be attracted 8 coming off from the attraction plate 14.

Even in a case where the object to be attracted 8 placed in a stand posture moves downward while being in contact with the attraction apparatus 12, a stopper 20 protruding from the attraction surface 18 is provided on the lower end of the attraction plate 14, whereby the object to be attracted 8 rides on the stopper 20 to prevent coming off from the attraction plate 14.

Figure 4:
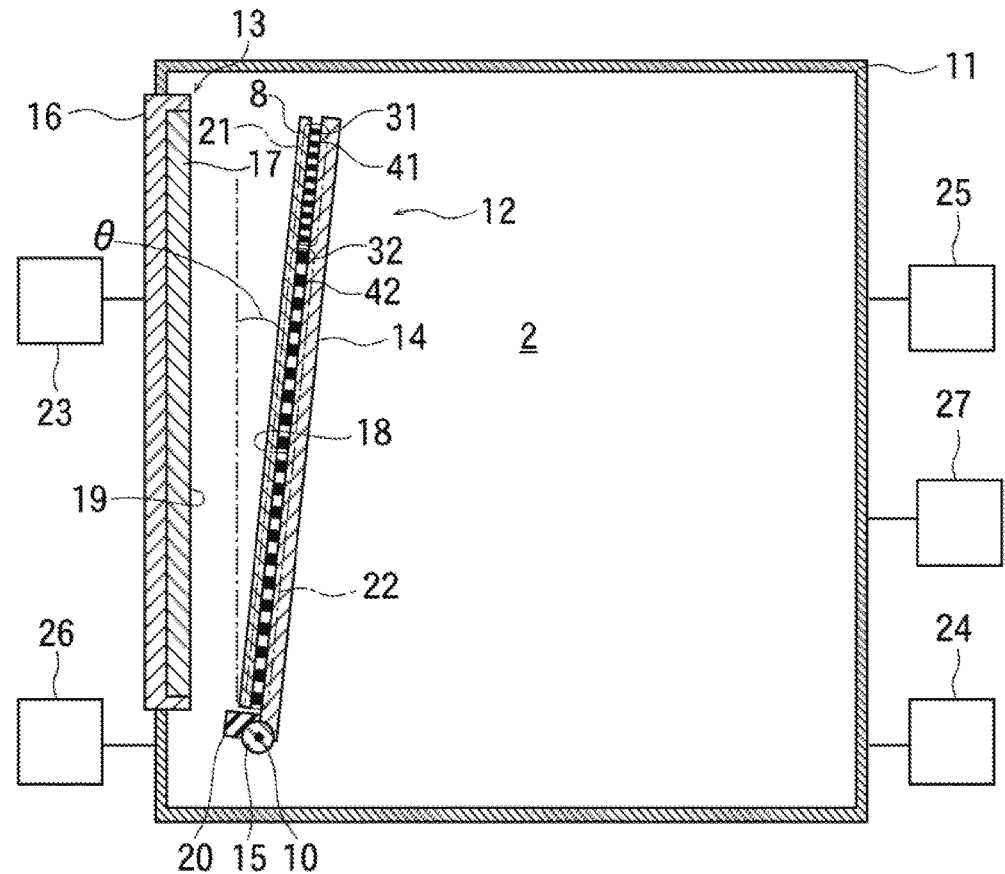
FIG. 4 is an explanatory diagram of an object to be attracted attracted onto an attraction plate placed in a stand posture.

As shown in FIG. 4, when the attraction plate 14 is placed in a stand posture, the object to be attracted 8 is facing the sputtering target 17, and growth of a conductive thin film on a surface facing the sputtering target 17 of the object to be attracted 8 is started by introducing sputter gas, such as, rare gas from a gas introduction device 25, applying a voltage to the cathode electrode 16 by the sputter power source 23, and sputtering the sputtering target 17.

As the film thickness of the growing conductive thin film increases, the gradient force between the first positive and negative electrodes 31 and 41 decreases, and the electrostatic force between the second positive and negative electrodes 32 and 42 increases, bringing the object to be attracted 8 into a state being attracted onto the attraction plate 14 by the electrostatic force.

On this occasion, among the four edges of the object to be attracted 8, the length of the part facing the first region 21 of the edge in the direction vertical to the axis of rotation 10 is set to a rate of less than a quarter of the length of the part facing the second region 22, and the object to be attracted 8 being placed vertically, or inclined by a predetermined angle θ into a stand posture oriented diagonally upward, and because the part of the object to be attracted 8 facing the second region 22 in the posture is attracted onto the attraction plate 14 by electrostatic force generated by the second positive and negative electrodes 32 and 42, the part facing the first region 21 will not dangle even when the part of the object to be attracted 8 facing the first upper region 21 is no longer being attracted onto the attraction plate 14.

After the object to be attracted 8 has been attracted and held on the attraction plate 14 by electrostatic attraction between the pair of the second positive and negative electrodes 32 and 42 to which a positive voltage and a negative voltage have been respectively applied, and the conductive thin film on the surface of the object to be attracted 8, application of the voltages to the first positive and negative electrodes 31 and 41 is terminated.

The conductive thin film is grown in a state where the object to be attracted 8 is attracted onto the attraction plate 14 by electrostatic attraction by the second positive and negative electrodes 32 and 42, and after the conductive thin film having a predetermined film thickness has been formed, the attraction plate 14 is turned from a stand posture to a lying posture, and the object to be attracted 8 having the conductive thin film formed thereon is conveyed to the outside of the vacuum chamber 11.

Although, in the example discussed above, the dielectric object to be attracted 8 not having a conductive thin film formed thereon is provided on the attraction plate 14 placed in a lying posture, and the attraction plate 14 is turned from a lying posture to a stand posture while applying a voltage to both the first positive and negative electrodes 31 and 41, and the second positive and negative electrodes 32 and 42, the attraction plate 14 may be turned from a lying posture to a stand posture, while applying the first voltage to only the first positive and negative electrodes 31 and 41.

Furthermore, the second positive and negative electrodes 32 and 42 may be applied with the second voltage immediately after placing the attraction plate 14 in a stand posture, or the second voltage may be applied after formation of the conductive thin film is started, and the gradient force of the first positive and negative electrodes 31 and 41 started decreasing.

In a case where the first positive and negative electrodes 31 and 4l have the aforementioned comb-teeth pattern, the density of the magnetic force lines is lower in the grip of the comb than the density of the magnetic force of the teeth of the comb, and the density of the magnetic force lines is non-uniform, so that electric discharge may occur when a high voltage is applied between the first positive and negative electrodes 31 and 41, which may lead to failure of the attraction apparatus 12.

Figure 7:
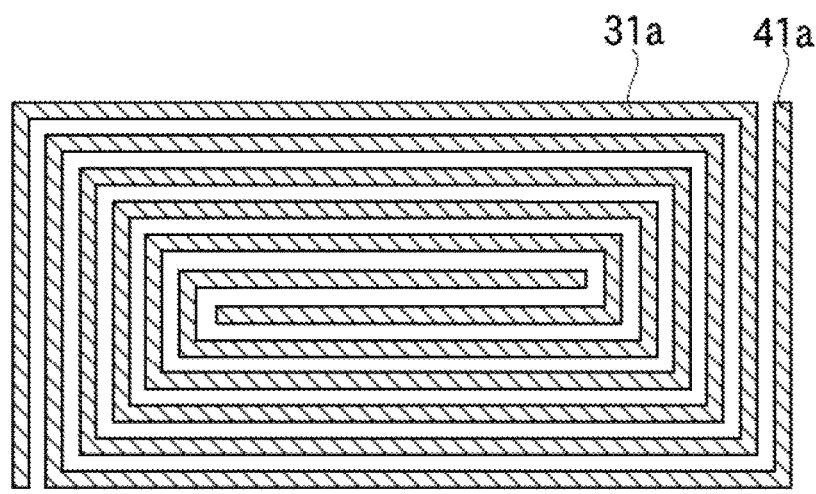
FIG. 7 shows first positive and negative electrodes having a double helical pattern.

In order to remove the grip of the comb so as to allow for application of a high voltage, it suffices to arrange the first positive and negative electrodes 31a and 41a in a double helical pattern, as shown in FIG. 7, for example, so that magnetic force lines may be formed with a uniform density.

Figure 8:
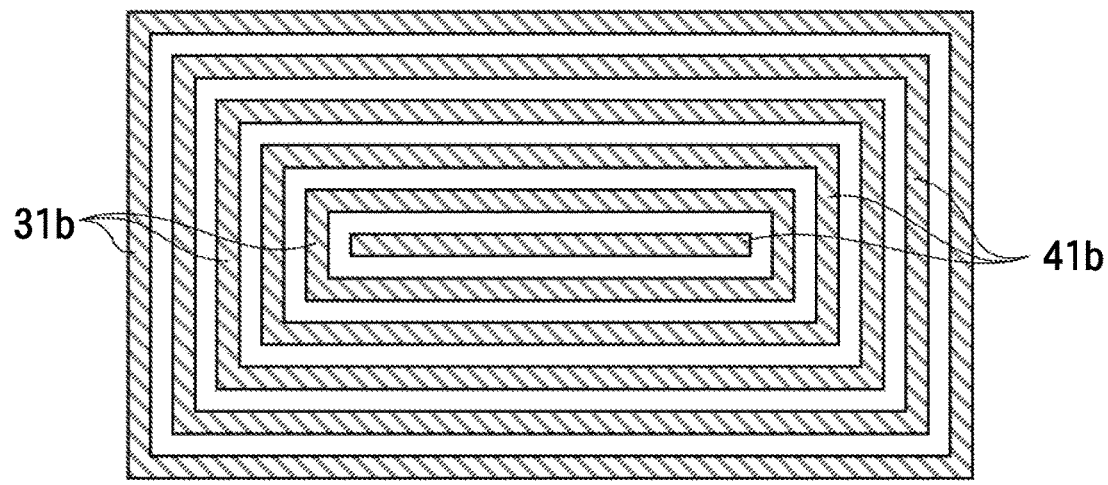
FIG. 8 shows first positive and negative electrodes having a concentrically and alternately arranged pattern.

In addition, as shown in FIG. 8, because the magnetic force lines are formed with a uniform density also by a concentrically and alternately arranged pattern of the first positive and negative electrodes 31b and 41b, it becomes possible to apply a high voltage without occurrence of electric discharge. In the case of a concentric pattern, a penetrating wiring is provided in the thickness direction of the attraction plate 14, so that a terminal on the backside and the first positive and negative electrodes 31b and 41b on the front side are electrically connected by the penetrating wiring.

It is possible to form a groove at a position between the first positive electrodes 31, 31a and 31b discussed above, and the first negative electrodes 41, 41a and 41b to flow the temperature-controlling heat medium gas through the groove. Forming a groove having, for example, a width of 400 μm and a depth of 400 μm may be satisfactory.

In the aforementioned case, the pattern of the first positive and negative electrodes 31b and 41b of FIG. 8 results in that, when the object to be attracted 8 is close contact to the attraction apparatus 12, the upper part of space between the first positive electrode 31b and the first negative electrode 41b turns out to be put a lid on, whereby the space between the first positive and negative electrodes 31b and 41b is isolated from the exterior of the space formed by the object to be attracted 8 and the attraction apparatus 12. In other words, when heat medium gas is supplied in the space between the first positive and negative electrodes 31b and 41b, it becomes difficult for the supplied heat medium gas to leak into the internal environment of the vacuum chamber 11 from the space between the first positive and negative electrodes 31b and 41b, whereby pressure in the space between the first positive and negative electrodes 31b and 41b rises, and in the results, thermal conductivity is increased.

Although the space between the first positive and negative electrodes 31b and 41b of FIG. 8 is surrounded by electrodes located at the outermost periphery of either the first positive electrode 31b or the first negative electrode 41b, a configuration, such that, the space between the first positive electrode 31c and the first negative electrode 41c is not surrounded by any of the first positive electrode 31c or the first negative electrode 41c may also prevent the heat medium gas from flowing out by surrounding the space between the first positive and negative electrodes 31c and 41c by an annular electrode 52c to which is applied a same voltage as the voltage of either the second positive electrode 32c or the second negative electrode 42c, as with the attraction apparatus 12c shown in FIGS. 9A and 9B.

The annular electrode 52c of FIGS. 9A and 9B is in contact with the second negative electrode 42c, and is applied with a same voltage as the voltage of the second negative electrode 42c.

A gas groove 26c is formed between the first positive electrode 31c and the first negative electrode 41c, and the annular electrode 52c is surrounding the first positive and negative electrodes 31c and 41c. Therefore, the gas groove 26c between the first positive and negative electrodes 31c and 41c is also surrounded by the annular electrode 52c.

When the second attraction voltage which generates electrostatic force between the pair of the second positive and negative electrodes 32c and 42c and the conductive thin film, is applied to the second positive and negative electrodes 32c and 42c, the second attraction voltage is also applied between the annular electrode 52c and the second positive electrode 32c, whereby electrostatic force is generated. In this example, the second negative electrode 42c is in contact with the annular electrode 52c and appears to be integrated.

When the provided object to be attracted 8 is attracted onto the second positive and negative electrodes 32c and 42c, and the annular electrode 52c by electrostatic force, the object to be attracted 8 comes into close contact with the attraction apparatus 12c, and the space between the first positive and negative electrodes 31c and 41c is blocked by the object to be attracted 8 and the annular electrode 52c.

Heat medium gas is introduced between the first positive and negative electrodes 31c and 41c from a through-hole formed on the attraction plate 14 in the aforementioned state, the amount of heat medium gas that flows out to the internal environment of the vacuum chamber 11 from the space between the object to be attracted 8 and the attraction apparatus 12c is reduced, and the space between the object to be attracted 8 and the attraction plate 14 is filled with heat medium gas, thereby the thermal conductivity between the object to be attracted 8 and the attraction plate 14 is improved.

In the aforementioned case, a flow path 46 through which heat medium liquid is supposed to flow is provided inside the attraction plate 14, and temperature-controlled heat medium liquid flow through the flow path 46, then, temperature control of the object to be attracted 8 can be performed. For example, flowing cooled heat medium liquid through the flow path 46 allows for cooling the object to be attracted 8.

Although the reference numeral 32c indicates the second positive electrode, and the reference numeral 42c indicates the second negative electrode in FIGS. 9A and 9B, the electrode indicated by the reference numeral 32c may be defined as the second negative electrode, and the electrode indicated by the reference numeral 42c may be defined as second positive electrode so that the second positive electrode 42c can surrounds the first positive and negative electrodes 31c and 41c.

The attraction apparatus 12c is configured to be turned from a lying posture to a stand posture so that the first region 21c is located above the second region 22c, and the first positive and negative electrodes 31c and 41c placed in a stand posture are located above the second positive and negative electrodes 32c and 42c.

When the object to be attracted 8 not having the conductive thin film formed on its surface is provided on the attraction apparatus 12c placed in a lying posture, the first attraction voltage having high-voltage is applied between the first positive and negative electrodes 31c and 41c, whereby the dielectric part of the object to be attracted 8 is attracted onto the first positive and negative electrodes 31c and 41c by gradient force generated by a non-uniform electric field formed between the first positive and negative electrodes 31c and 41c. In the aforementioned state, rotation of the attraction apparatus 12c turns the attracted object to be attracted 8 from a lying posture to a stand posture together with the attraction apparatus 12c.

Similarly to the attraction apparatus 12c, the upper part of the object to be attracted 8 is attracted onto the first positive and negative electrodes 31c and 41c by the gradient force, so that therefore the upper part of the object to be attracted 8 placed in a stand posture will not dangle.

When a conductive thin film is formed on the surface of the object to be attracted 8 placed in a stand posture, the second attraction voltage which generates electrostatic force between the pair of the second positive and negative electrodes 32c and 42c, and the conductive thin film is applied between second positive and negative electrodes 32c and 42c, and the conductive thin film is attracted onto the second positive and negative electrodes 32c and 42c.

On this occasion, the annular electrode 52c is located in the vicinity of the upper end of the object to be attracted 8 located above the first positive and negative electrodes 31c and 41c, and the second attraction voltage is also applied between the annular electrode 52c and the second positive electrode 32c, whereby the upper end of the object to be attracted 8 is electrostatically attracted.

Therefore, the upper end of the object to be attracted 8 will not dangle even when the voltage applied to the first positive and negative electrodes 31c and 41c is reduced so that the gradient force disappears, and the dielectric part of the object to be attracted 8 is no longer attracted by the first positive and negative electrodes 31c and 41c.

In the attraction apparatus 12 shown in FIG. 5, although application of the voltage to the first positive and negative electrodes 31 and 41 is terminated after having electrostatically attracted and held the object to be attracted 8 by the second positive and negative electrodes 32 and 42, the voltage being applied may be reduced without terminating application of the voltage to the first positive and negative electrodes 31 and 41. A voltage of a magnitude in a range in which abnormal electrical discharge does not occur may also be applied to the first positive and negative electrodes 31 and 41 to generate electrostatic force between the pair of the first positive and negative electrodes 31 and 41, and the conductive thin film.

In the aforementioned case, attraction force is generated also in the first region 21, so that the upper position of the object to be attracted 8 is also attracted onto the attraction plate 14 placed in a stand posture, thereby the thermal conductivity between the object to be attracted 8 and the attraction plate 14 is improved.

Although the axis of rotation 10 passes through the center of the rotating shaft 15 and, in a stand posture, the axis of rotation 10 and the rotating shaft 15 is located below the first and the second regions 21 and 22 in the example discussed above, the attraction apparatuses 12 and 12c may be configured such that the first regions 21 and 21c are located above the second regions 22 and 22c when placed in a stand posture, the axis of rotation 10 and the rotating shaft 15 may turn out to be located above the attraction apparatuses 12 and 12c.

Next, another example of the present disclosure will be discussed.

Figure 10:
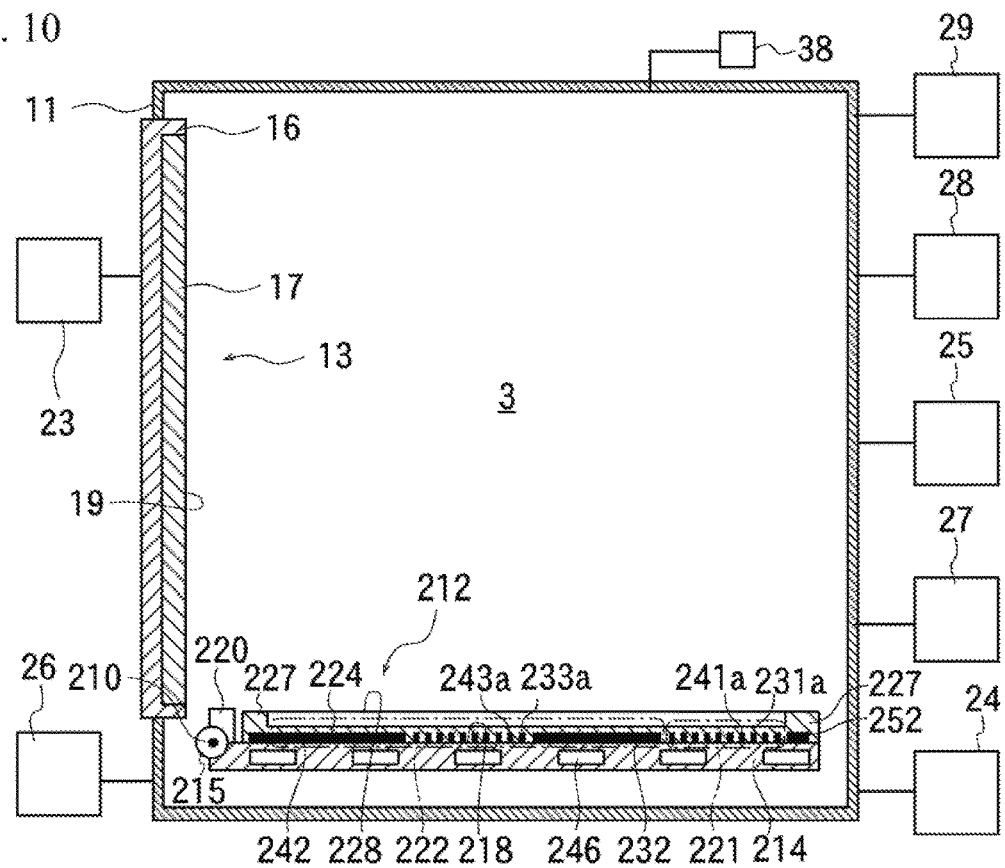
FIG. 10 is an explanatory diagram of the interior of a vacuum apparatus of a second example in which an attraction apparatus of the second example is placed in a lying posture.

Taking the vacuum apparatus 2 and the attraction apparatuses 12 and 12c discussed referring to FIGS. 1 to 9 as a first example, the reference numeral 3 of FIG. 10 indicates a vacuum apparatus of a second example of the present disclosure, and the reference numeral 212 indicates an attraction apparatus of the second example. In the description of FIG. 10 and FIGS. 11 to 19 discussed below, members identical to those of the vacuum apparatus 2 of FIGS. 1 and 2 are provided with the same the reference numerals, and explanation thereof being omitted. Note that the vacuum apparatuses 2 and 3 of the first and the second examples have a thin film forming device for forming a conductive thin film, with a magnetron sputtering device is discussed as the thin film forming device as an example thereof. Although a magnetron magnet is provided on the backside of the cathode electrode 16, the magnetron magnet is omitted in the drawing.

A second example of an attraction apparatus 212 of the second example has an attraction plate 214 having a shape of a quadrangle, including a square and a rectangle, and a rod-shaped rotating shaft 215 provided along one edge of the attraction plate 214, the rotating shaft 215 is connected to the rotating device 26, and the rotating shaft 215 is rotated by the operation of the rotating device 26.

The rotation is a rotation about an axis of rotation 210 passing through the section center of the rotating shaft 215, and parallel to the longitudinal direction of the rotating shaft 215, so that the rotation of the rotating shaft 215 causes the attraction apparatus 212 to rotate about the axis of rotation 210.

Here, the attraction apparatus 212 is configured to rotate by a predetermined angle less than 360 degrees, and by rotation, the attraction apparatus 212 is configured to be capable of changing, its posture between a lying posture in which the attraction plate 214 is placed horizontally and a static stand posture in which the attraction plate 214 is placed at an angle close to the vertical direction.

Defining the surface of the attraction plate 214 as an attraction surface 218, the attraction plate 214 placed in a lying posture lies generally horizontally with the attraction surface 218 facing upward, whereas, in a stand posture, the attraction plate 214 held still with the attraction surface 218 facing obliquely upward.

Figure 11:
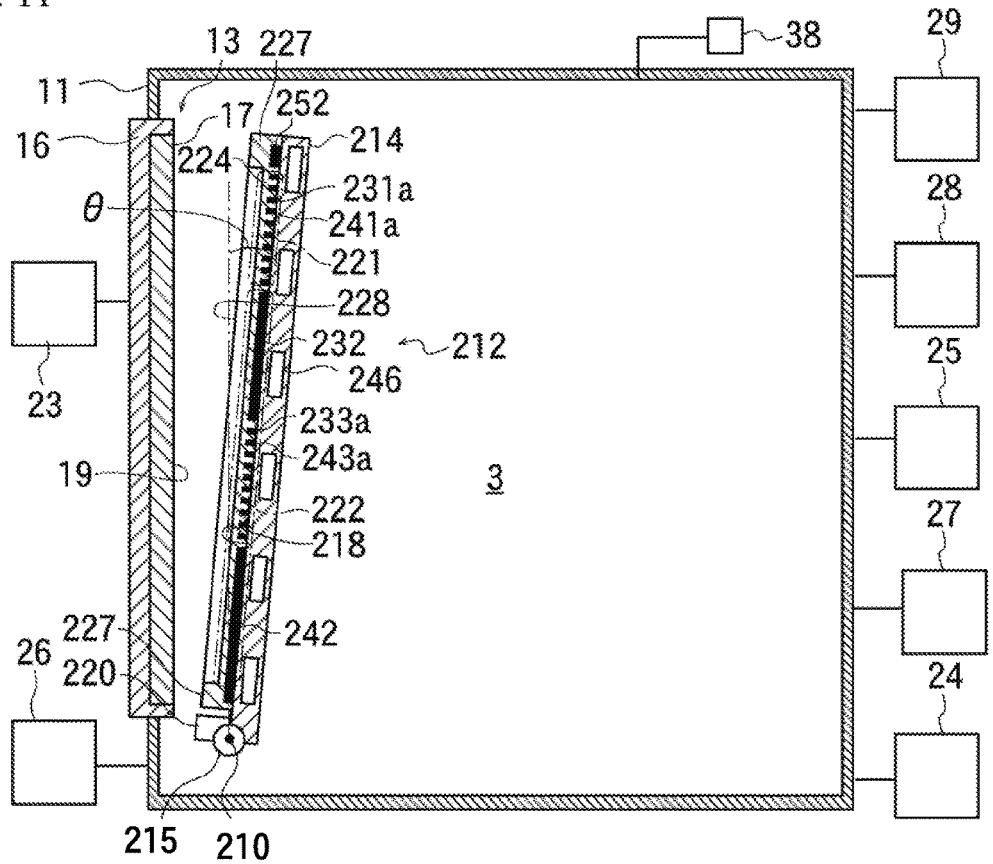
FIG. 11 is an explanatory diagram of the interior of the vacuum apparatus of the second example in which the attraction apparatus of the second example is placed in a stand posture.

FIG. 10 shows the attraction apparatus 212 placed in a lying posture, and FIG. 11 shows the attraction apparatus 212 placed in a stand posture. A posture in which the attraction surface 218 is inclined by an angle θ less than ±10 degrees relative to a vertical state is also regarded as a stand posture. In addition, a posture in which the attraction surface 218 is inclined by a predetermined angle relative to a horizontal posture is also regarded as a lying posture. The attraction apparatus 212 of the second example is identical to the attraction apparatuses 12 and 12c of the first example, from this viewpoint.

Although in the attraction apparatuses 12 and 12c of the first example, that the surface of the first positive and negative electrodes 31, 31a, 31b, 31c, 41, 41a, 41b and 41c, and the surface of the second positive and negative electrodes 32, 32c, 42 and 42c are exposed, and the object to be attracted 8 comes into contact with the upper end of the electrodes 31, 31a, 31b, 31c, 41, 41a, 41b, 41c, 32, 32c, 42 and 42c, a dielectric protection film 224 is provided on the attraction surface 218 of the attraction apparatus 212 of the second example, so that a surface 228 of the protection film 224 is exposed.

Figures 16A, 16B:
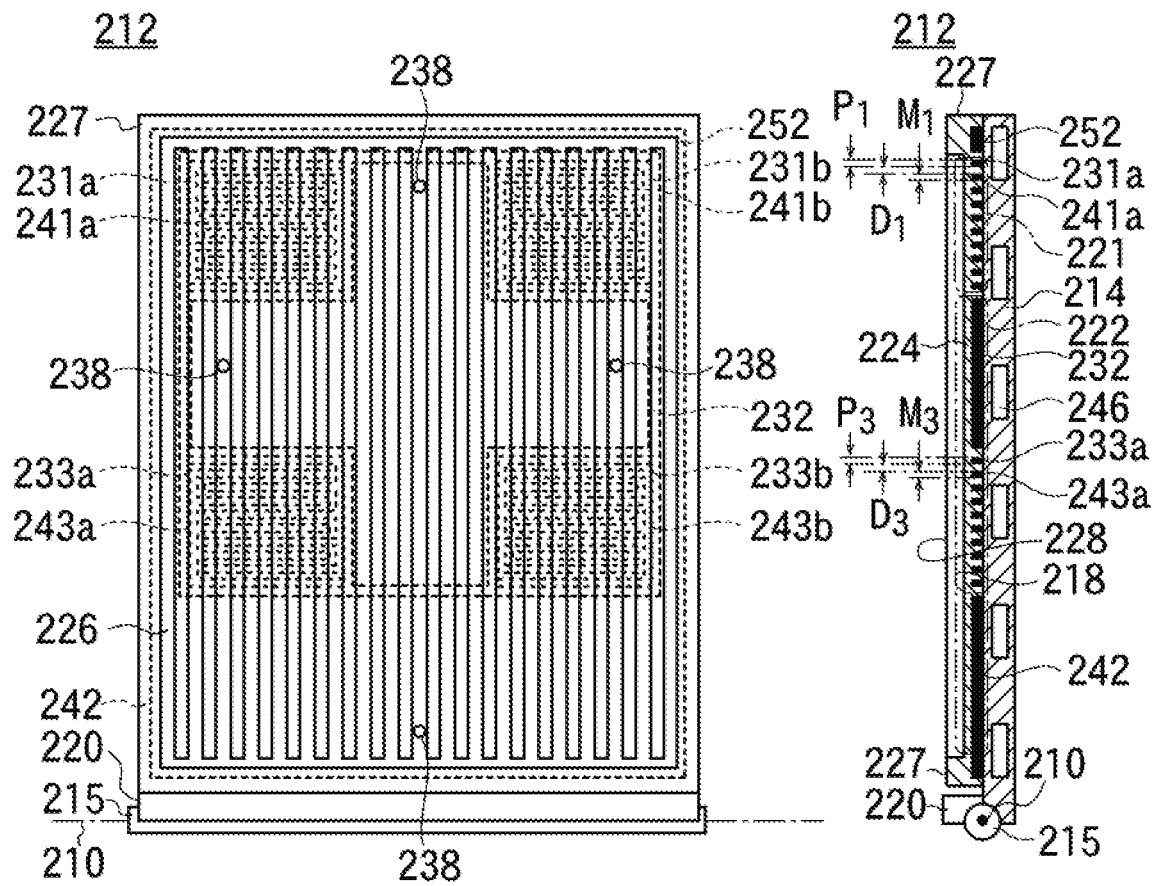
FIG. 16A is a plan view showing a relationship of relative positions of a gas groove of the attraction apparatus of the second example, a ring-shaped ridge, and an electrode.
FIG. 16B is a cross-sectional view taken along line C-C of FIG. 15A.
Figure 16C:
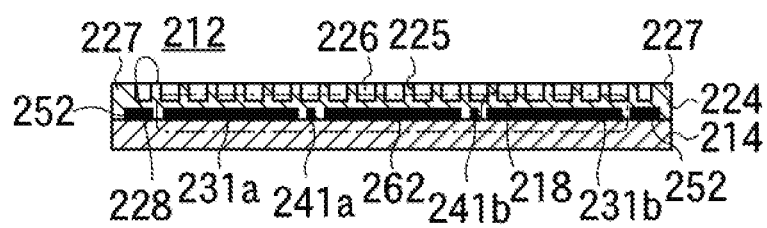
FIG. 16C is a cross-sectional view taken along line E-E of FIG. 15A.

FIG. 16A is a plan view of the attraction apparatus 212 of the second example, in FIG. 16A, a dashed line shows an electrode formed on the attraction plate 214 and located on a lower layer of protection film 224.

Figure 15A:
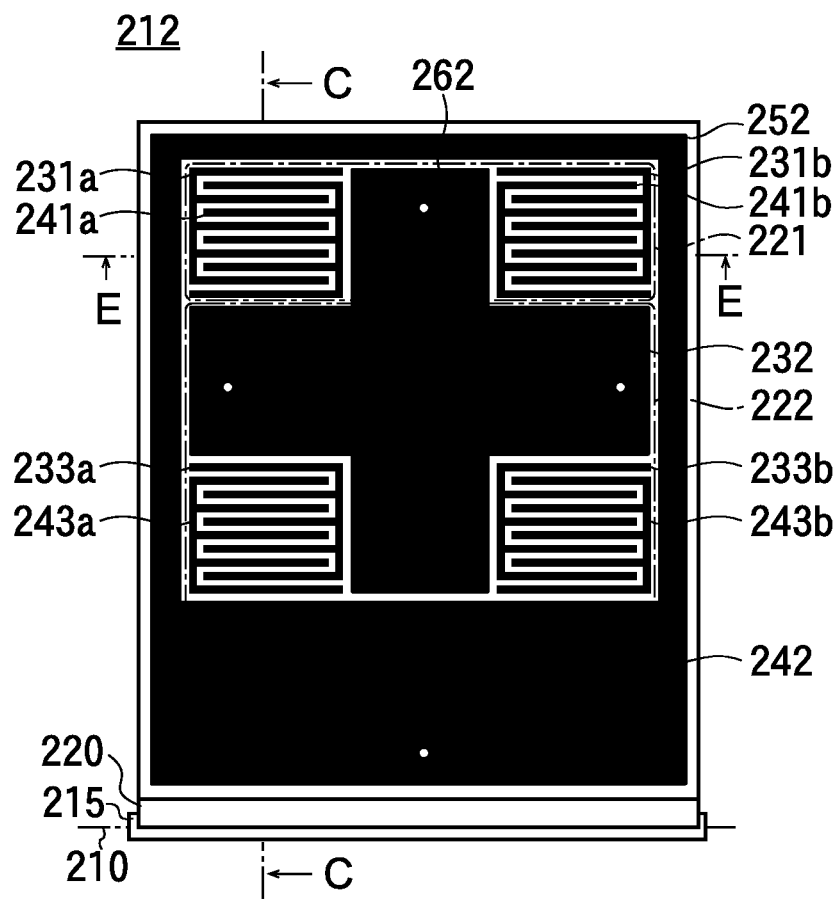
FIG. 15A is a plan view illustrating an electrode of the attraction apparatus of the second example.
Figure 15B:
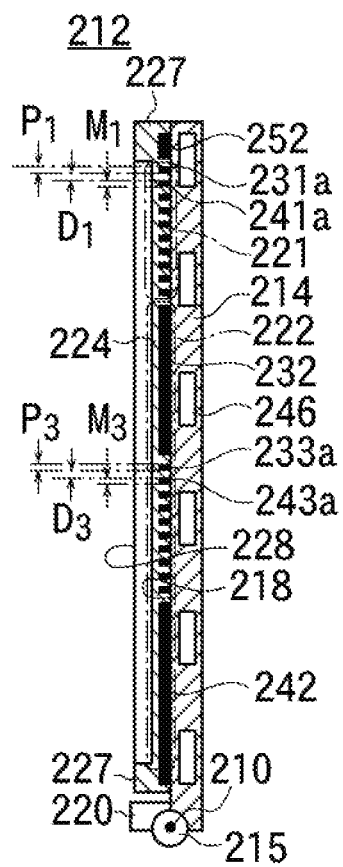
FIG. 15B is a cross-sectional view taken along line C-C of FIG. 15A.
Figure 15C:
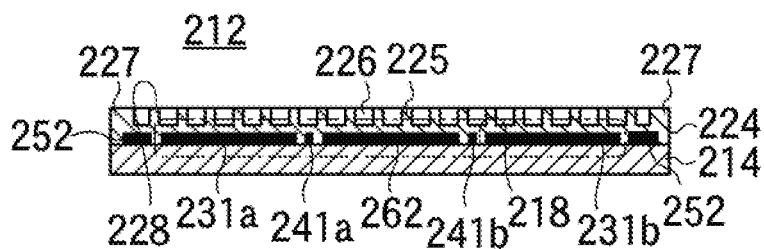
FIG. 15C is a cross-sectional view taken along line E-E of FIG. 15A.
Figure 17A:
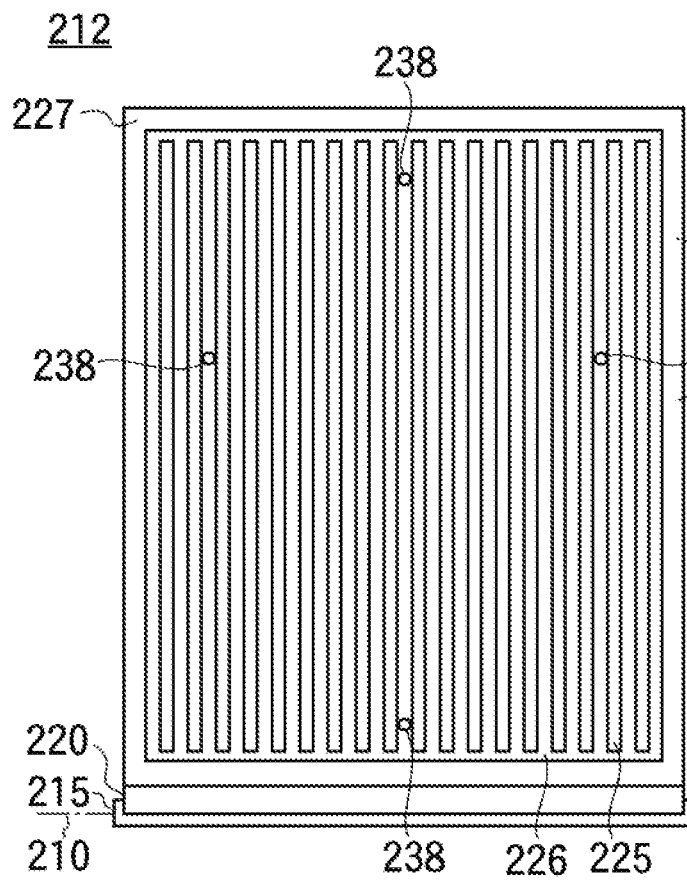
FIG. 17A is a plan view showing a gas groove and a ring-shaped ridge of the attraction apparatus of the second example.
Figure 17B:
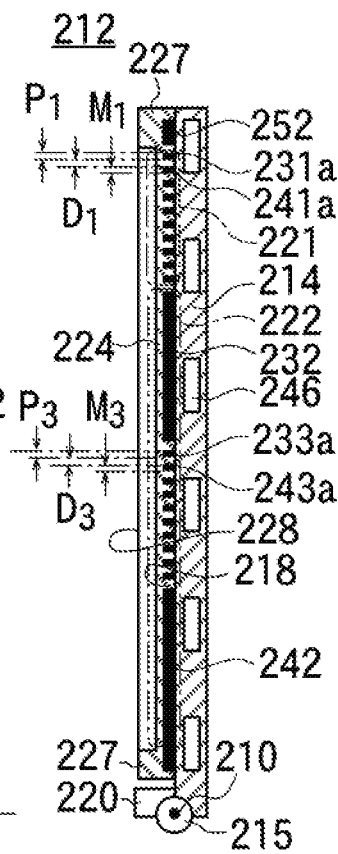
FIG. 17B is a cross-sectional view taken along line C-C of FIG. 15A.
Figure 17C:
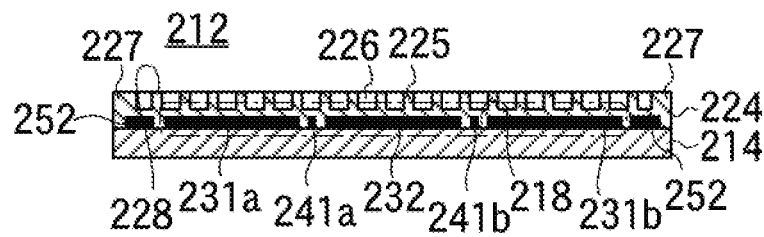
FIG. 17C is a cross-sectional view taken along line E-E of FIG. 15A.

FIGS. 15B, 16B and 17B are cross-sectional views taken along line C-C of the attraction apparatus 212 of FIG. 15A, and FIGS. 15C, 16C and 17C are cross-sectional views taken along line E-E of the attraction apparatus 212 of FIG. 15A. The reference numeral 224 indicates the protection film.

FIG. 17A, which is a plan view omitting the dashed line indicating the electrode, has omitted the protection film 224 and members located lower than the protection film 224.

The attraction apparatus 212 of the second example and a vacuum apparatus 3 of the second example will be discussed, referring to the drawings. On the attraction surface 218, a first region 221 located at the upper part of the attraction apparatus 212 when the attraction apparatus 212 is placed in a stand posture, and a second region 222 located below the first region 221 when placed in a stand posture, are provided.

On the attraction surface 218 of the first region 221, first positive electrodes 231a and 231b, first negative electrodes 241a and 241b, and an auxiliary electrode 262 are provided, and a second positive electrode 232 and a second negative electrode 242 are provided on the attraction surface 218 of the second region 222.

Here, the first positive electrodes 231a and 231b have the leftward first positive electrode 231a and the rightward first positive electrode 231b separated from each other, and the first negative electrodes 241a and 241b are also meant to be the leftward first negative electrode 241a and the rightward first negative electrode 241b separated from each other.

The first positive electrodes 231a and 231b, and the first negative electrodes 241a and 241b are formed of a plurality of elongated conductive members arranged in a comb-teeth shape on the attraction surface 218, with the comb-teeth part forming the leftward first positive electrode 231a and the comb-teeth part forming the leftward first negative electrode 241a being alternately provided at a regular interval, and similarly the comb-teeth part forming the first rightward positive electrode 231b and the comb-teeth forming the first rightward negative electrode 241b also being alternately provided at a same regular interval as the regular interval of the leftward electrodes.

The auxiliary electrode 262 is provided at a position in the first region 221 between the pair of the leftward first positive and negative electrodes 231a and 241a, and the pair of the rightward first positive and negative electrodes 231b and 241b. The attraction apparatus 212 having the object to be attracted 8 provided thereon is configured such that the upper part of the object to be attracted 8 faces the first positive and negative electrodes 231a, 241a, 231b and 241b, and the auxiliary electrode 262 when being in a lying posture and turned from a lying posture to a stand posture.

The second positive electrode 232 and the second negative electrode 242 are formed with a large width instead of a comb-teeth shape to have a larger electrode area size, in order to generate strong electrostatic force with a low voltage when a conductive thin film is formed on the object to be attracted 8.

In the second region 222, the second positive electrode 232 or a negative electrode is provided at a position adjacent to the first region 221, so that when a conductive thin film is formed on the object to be attracted 8, electrostatic force is generated between the second positive electrode 232 or the negative electrode and the object to be attracted 8 at as high a position as possible of the object to be attracted 8 placed in a stand posture, and in the present example, the second positive electrode 232 or the second negative electrode 242 having a reverse polarity against the second positive electrode 232 or the second negative electrode 242 adjacent to the first region 221 is provided at a position in the second region 222 separated from the first region 221 and facing the lower part of the object to be attracted 8 placed in a stand posture.

Here, third positive electrodes 233a and 233b, and third negative electrodes 243a and 243b are provided between a part of the second positive electrode 232 adjacent to the first positive and negative electrodes 231a, 241a, 231b and 241b, and the second negative electrode 242 located below the adjacency part when the attraction apparatus 212 is placed in a stand posture.

The third positive electrodes 233a and 233b, and the third negative electrodes 243a and 243b are formed of a plurality of elongated conductive members arranged in a comb-teeth shape over the attraction surface 218, similarly to the first positive and negative electrodes 231a, 231b, 241a and 241b, the comb-teeth part of the leftward third positive electrode 233a and the comb-teeth part of the leftward third negative electrode 243a are alternately provided at a same regular interval as the regular interval of the first positive and negative electrodes 231a, 231b, 241a and 241b, and the comb-teeth part of the rightward third positive electrode 233b and the comb-teeth part of the rightward third negative electrode 243b are also alternately provided at a same regular interval as the regular interval of the first positive and negative electrodes 231a, 231b, 241a and 241b.

The width of the comb-teeth part of the first positive and negative electrodes 231a, 231b, 241a and 241b, and the width of the comb-teeth part of the third positive and negative electrodes 233a, 233b, 243a and 243b are made equal.

An annular electrode 252 is provided on the surface in the vicinity of an edge of the attraction plate 214. The annular electrode 252 is elongated in parallel to the edge of attraction plate 214 in the vicinity of the edge of the attraction plate 214, and the first region 221 and the second region 222 are provided inside the annular electrode 252 and surrounded by the annular electrode 252.

Therefore, the first positive and negative electrodes 231a, 231b, 241a and 241b, the second positive and negative electrodes 232 and 242, the third positive and negative electrodes 233a, 233b, 243a and 243b, and the auxiliary electrode 262 are surrounded by the annular electrode 252.

Similarly to the attraction apparatuses 12 and 12c of the first example, the side surface of the first positive electrodes 231a and 231b, and the side surface of the first negative electrodes 241a and 241b are provided in parallel with spaced apart from each other by a first distance $D_1$, and the side surface of the second positive electrode 232 and the side surface of the second negative electrode 242 are provided spaced apart from each other by a second distance (distance of the shortest part) longer than the first distance $D_1$.

The attraction apparatus 212 of the second example is also similar to the attraction apparatuses 12 and 12c of the first example in that the width $P_1$ of the first positive electrodes 231a and 231b, and the width $M_1$ of the first negative electrodes 241a and 241b are formed to be shorter than the width of the second positive electrode 232 (width of the narrowest part of the second positive electrode), and also shorter than the width of the second negative electrode 242 (width of the narrowest part of the second negative electrode).

In addition, the side surface of the third positive electrodes 233a and 233b, and the side surface of the third negative electrodes 243a and 243b are provided in parallel with spaced apart from each other by a third distance $D_3$ equal to the first distance $D_1$ and, as discussed above, the width $P_3$ of the third positive electrodes 233a and 233b, and the width $M_3$ of the third negative electrodes 243a and 243b are made equal to the widths $P_1$ and $M_1$ of the first positive and negative electrodes 231a, 231b, 241a and 241b, respectively.

The first distance $D_1$ and the third distance $D_3$ are made shorter than the second distance.

The vacuum chamber 11 is connected to the ground potential, and the attraction power source 24 provided outside the vacuum chamber 11 applies voltages having a same magnitude to the first positive electrodes 231a and 231b, and the third positive electrodes 233a and 233b, and voltages of a same magnitude are applied to the first negative electrodes 241a and 241b, and the third negative electrodes 243a and 243b.

Here, positive voltages having a same value are applied to the first positive electrodes 231a and 231b, and the third positive electrodes 233a and 233b, and negative voltages having a same value are applied to the first negative electrodes 241a and 241b and the third negative electrodes 243a and 243b. Particularly, the voltages applied to the first positive electrodes 231a and 231b, and the third positive electrodes 233a and 233b, and the voltages applied to the first negative electrodes 241a and 241b and the third negative electrodes 243a and 243b have a same absolute value but different polarities.

In addition, the second positive electrode 232 and the second negative electrode 242 have applied having voltages of a same absolute value but different polarities. Specifically, a positive voltage is applied to the second positive electrode 232, and a negative voltage is applied to the second negative electrode 242.

Here, the auxiliary electrode 262 is in contact with the second positive electrode 232, and the auxiliary electrode 262 is configured to be applied with a voltage having a same magnitude and a same polarity as with the second positive electrode 232.

Defining the positive voltage applied between the first positive electrodes 231a and 231b, and the first negative electrodes 241a and 241b as the first attraction voltage, the positive voltage applied between the second positive electrode 232 and the second negative electrode 242 as the second attraction voltage, and the positive voltage applied between the third positive electrodes 233a and 233b, and the third negative electrodes 243a and 243b as a third attraction voltage, the first attraction voltage and the third attraction voltage are of a same magnitude, and the first and the third attraction voltages is larger than the second attraction voltage.

The strength of the electric field and the curvature of the electric force lines generated between the first positive and negative electrodes 231a, 231b, 241a and 241b, and between the third positive and negative electrodes 233a, 233b, 243a and 243b becomes larger than the strength of the electric field and the curvature of the electric force lines generated between the second positive and negative electrodes 232 and 242, whereby a non-uniform electric field is generated.

The gradient force becomes larger when the dielectric is provided among the electric force lines formed between the first positive and negative electrodes 231a, 231b, 241a and 241b, or among the electric force lines formed between the third positive and negative electrodes 233a, 233b, 243a and 243b than when the dielectric is provided among the electric force lines formed between the second positive and negative electrodes 232 and 242, and therefore the dielectric is attracted by stronger attraction force.

In the attraction plate 214, the protection film 224 is formed on the protection film 224 formed over the surface of the electrodes 231a, 231b, 232, 233a, 233b, 241a, 241b, 242, 243a, 243b, 252 and 262, and over the adsorption surface 218 exposed between the electrodes 231a, 231b,

232, 233*a*, 233*b*, 241*a*, 241*b*, 242, 243*a*, 243*b*, 252 and 262, so that the protection film 224 is exposed on the surface of the attraction apparatus 212.

Therefore, the back surface of the object to be attracted 8 comes into contact with the protection film 224 when the object to be attracted 8 is provided on the attraction apparatus 212, and the surface of the electrodes 231*a*, 231*b*, 232, 233*a*, 233*b*, 241*a*, 241*b*, 242, 243*a*, 243*b*, 252 and 262 facing the back surface of the object to be attracted 8 with the protection film 224 located therebetween.

As shown in FIGS. 15C to 19C, the attraction apparatuses 212, 212*a* and 212*b* have a gas groove 226 in the form of a groove formed on the protection film 224, so that heat medium gas discussed below will be introduced into the gas groove 226.

Between the two gas grooves 226, a support protrusion 225 having an upper end higher than the bottom surface of the gas grooves 226 is formed, and a ring-shaped ridge 227 is formed at a position right above the annular electrode 252 along a direction in which the annular electrode 252 extends.

The ring-shaped ridge 227 is located together with the annular electrode 252 in the vicinity of an edge of the attraction plate 214, and the part where the ring-shaped ridge 227 located right above the annular electrode 252 is made ring, and the gas groove 226 and the support protrusion 225 are surrounded by the ring-shaped ridge 227.

The surface of the attraction surface 218 is made flat, so that the relationship of height from the surface of the attraction plate 214 to the upper end of the protection film 224 is such that the height to the upper end of support protrusion 225 is equal to or lower than the height to the upper end of the ring-shaped ridge 227.

Therefore, the upper end of the ring-shaped ridge 227 comes into contact with the object to be attracted 8 in ring-shape when the object to be attracted 8 is provided on the attraction apparatus 212.

As will be discussed below, when a voltage is applied to the annular electrode 252 and the annular electrode 252 attracts the conductive thin film formed on the object to be attracted 8 by electrostatic force so that the object to be attracted 8 comes into close contact with the attraction apparatus 212, the part where the object to be attracted 8 and the ring-shaped ridge 227 adhere to each other is ring-shape, and the space inside the ring-shaped ridge 227 turns into a state capped by the object to be attracted 8, whereby the space formed between the ring-shaped ridge 227 and the attraction apparatus 212 is separated from the internal atmosphere of the vacuum chamber 11.

In the attraction apparatus 212 of the second example, a plurality of gas-introducing holes 238 are formed on the protection film 224 at the bottom surface of the gas groove 226 and the attraction plate 214, each of the gas-introducing holes 238 penetrating through the protection film 224 and the attraction plate 214, and being connected to a gas supply device 28 provided outside the vacuum chamber 11, so that heat medium gas is supplied from the gas supply device 28 to the gas groove 226 through the gas-introducing hole 238.

The gas groove 226 located between the support protrusions 225 is connected to each other by the gas groove 226 located between the support protrusion 225 and the ring-shaped ridge 227 so that the interior thereof is in communication with each other.

When the annular electrode 252 attracts the conductive thin film on the object to be attracted 8 provided on the attraction apparatus 212 by electrostatic force, the back surface of the object to be attracted 8 and the upper end of the ring-shaped ridge 227 adhere to each other.

In this instance, the gas grooves 226 being in communication with each other turn into a state closed the lid by the object to be attracted 8, the gas groove 226 is surrounded by the ring-shaped ridge 227 and separated from the internal environment of the vacuum chamber 11, whereby the heat medium gas introduced into each of the gas grooves 226 from gas-introducing hole 238 fills the space between the object to be attracted 8 and the attraction apparatus 212. As a result, heat transfer occurs due to convection whereby the thermal conductivity between the attraction apparatus 212 and the object to be attracted 8 increases.

Next, there will be discussed a procedure of attracting the object to be attracted 8 to form a conductive thin film using the vacuum apparatus 3 of the second example, similarly to the vacuum apparatus 2 of the first example.

The vacuum-exhausting device 27 is connected to the vacuum chamber 11, and the interior of the vacuum chamber 11 is vacuum-exhausted by the vacuum-exhausting device 27 so as to form vacuum environment. In this instance, the interior of the gas groove 226 is also vacuum-exhausted.

Figure 12:
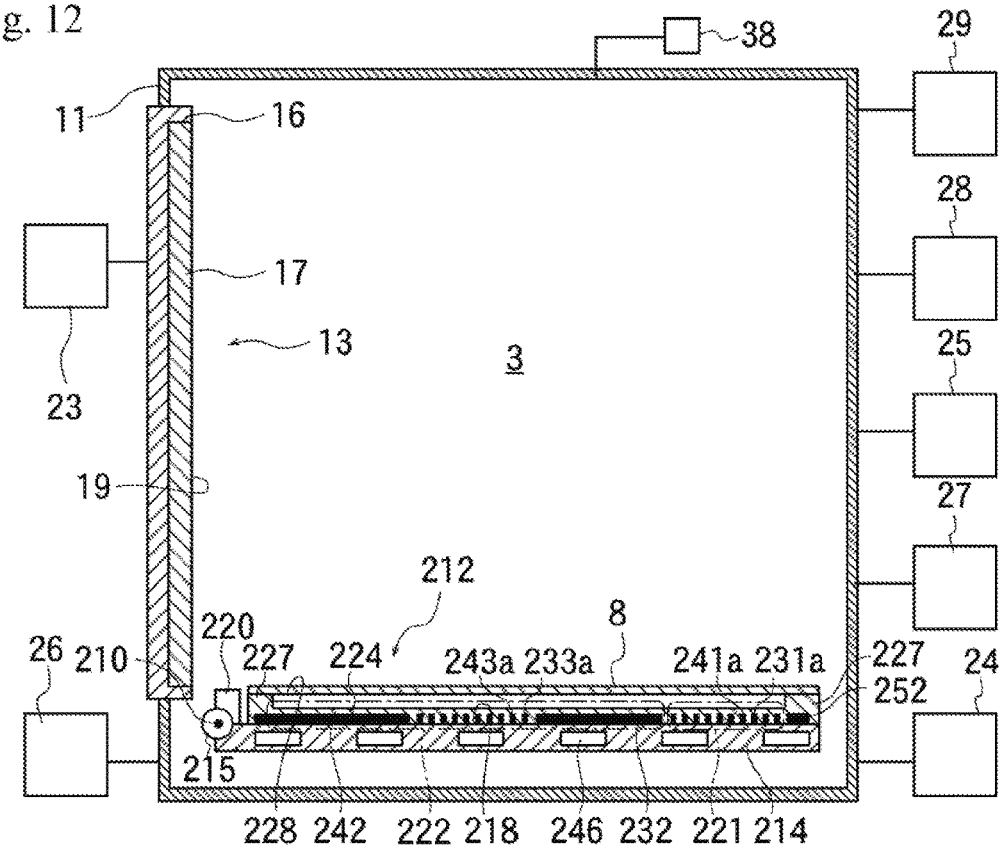
FIG. 12 is an explanatory diagram of the interior of the vacuum apparatus of the second example including the attraction apparatus of the second example placed in a lying posture with an object to be attracted provided thereon.

First, the object to be attracted 8 is conveyed into the interior of the vacuum chamber 11 while maintaining the vacuum environment in the vacuum chamber 11 and, as shown in FIG. 12, the object to be attracted 8 is arranged on the attraction plate 214 placed in a lying posture. In this instance, the surface of the first positive and negative electrodes 231*a*, 231*b*, 241*a* and 241*b*, the surface of the second positive and negative electrodes 232 and 242, the surface of the third positive and negative electrodes 233*a*, 233*b*, 243*a* and 243*b*, the surface of the auxiliary electrode 262, and the surface of the annular electrode 252 face the back surface of the object to be attracted 8 in a state where the protection film 224 is located therebetween.

In the aforementioned state, the first attraction voltage is applied between the first positive and negative electrodes 231*a*, 231*b*, 241*a* and 241*b*, and the third attraction voltage is applied between the third positive and negative electrodes 233*a*, 233*b*, 243*a* and 243*b*. In this instance, the second attraction voltage may or may not be applied between the second positive and negative electrodes 232 and 242.

No conductive thin film having been formed on the object to be attracted 8, a non-uniform electric field is formed between the first positive and negative electrodes 231*a*, 231*b*, 241*a* and 241*b*, and between the third positive and negative electrodes 233*a*, 233*b*, 243*a* and 243*b*, so that the dielectric part of the object to be attracted 8 is attracted onto the first and the third positive and negative electrodes 231*a*, 231*b*, 233*a*, 233*b*, 241*a*, 241*b*, 243*a* and 243*b* by the generated gradient force.

The rotating shaft 215 is rotated by the rotating device 26 in a state where the object to be attracted 8 is attracted. Here, the attraction apparatus 212 is rotated about the axis of rotation 210 by about 90 degrees, and the attraction apparatus 212 is turned from a lying posture to a stand posture in which the first region 221 is located above the second region 222. The object to be attracted 8 rotates together with the attraction plate 214 without coming off and is turned from a lying posture to a stand posture, while being attracted onto the attraction plate 214 by the first and the third positive and negative electrodes 231*a*, 231*b*, 233*a*, 233*b*, 241*a*, 241*b*, 243*a* and 243*b*.

A stopper 220 protruding from the attraction surface 218 is provided below the attraction plate 214 placed in a stand posture, and even when the object to be attracted 8 placed in a stand posture moves downward while being contact with the surface 228 of the attraction apparatuses 12, 12*c* and 212, the object to be attracted 8 abuts on the stopper 220 so that the downward movement is stopped, thereby preventing the object to be attracted 8 from coming off from the attraction plate 214.

When the object to be attracted 8 abuts the stopper 220, there is a risk that the object to be attracted 8 may cause a buckling phenomenon due to the weight of the object to be attracted 8. In order to prevent occurrence of a buckling phenomenon, partial coming-off (floating) from the attraction surface 218 is prevented by generating gradient force (normal reaction) in accordance with the friction coefficient between the object to be attracted 8 and the surface 228 of the attraction apparatuses 12, 12c and 212.

Figure 13:
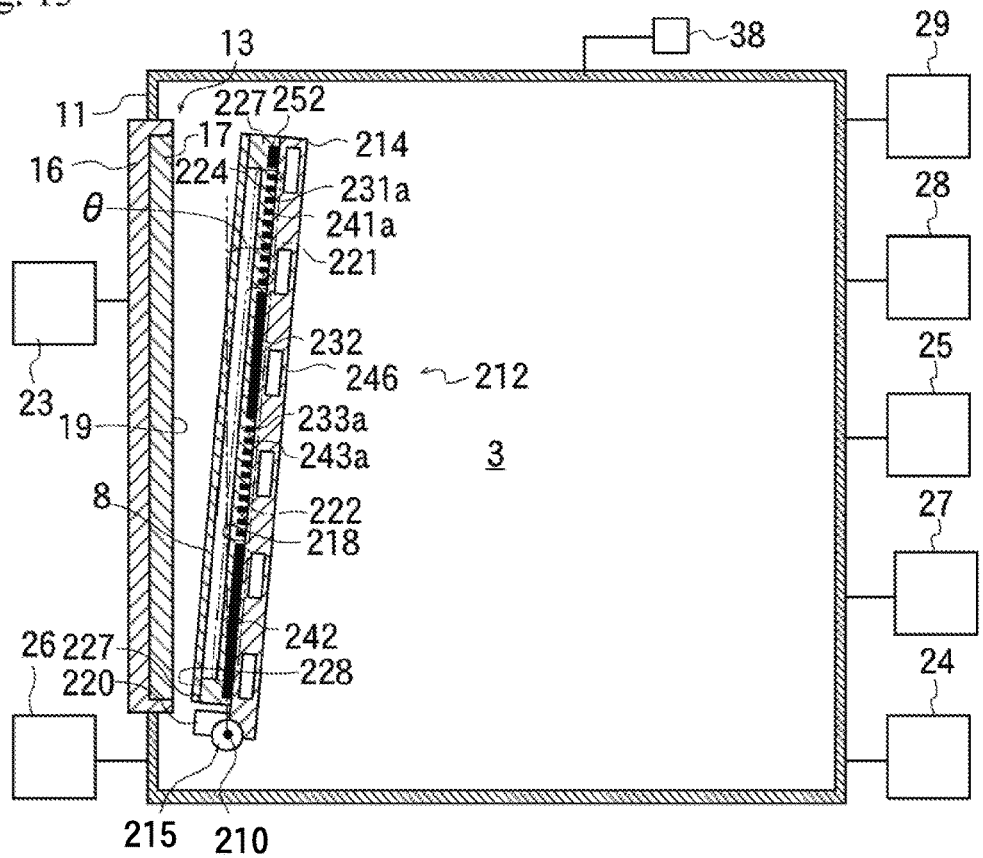
FIG. 13 is an explanatory diagram of the interior of the vacuum apparatus of the second example including the attraction apparatus of the second example placed in a stand posture with an object to be attracted provided therein.

FIG. 13 shows a state in which the attraction plate 214 and the object to be attracted 8 are placed in a stand posture.

The sputtering target 17 as a part of the thin film forming device is provided inside the vacuum chamber 11, and the surface of the object to be attracted 8 being placed in a stand posture faces the sputtering target 17. Sputter gas, such as, rare gas is introduced from the gas introduction device 25 into the vacuum environment inside the vacuum chamber 11, a sputter voltage is applied to the cathode electrode 16 by the sputter power source 23, and the sputtering target 17 is sputtered.

In this instance, the electric power to be output from the sputter power source 23 to the sputtering target 17 is controlled, and the sputtering target 17 is sputtered in a state where electric power of a predetermined magnitude is supplied to the sputtering target 17, thereby starting the growth of a conductive thin film on a surface of the object to be attracted 8 facing the sputtering target 17.

Figure 14:
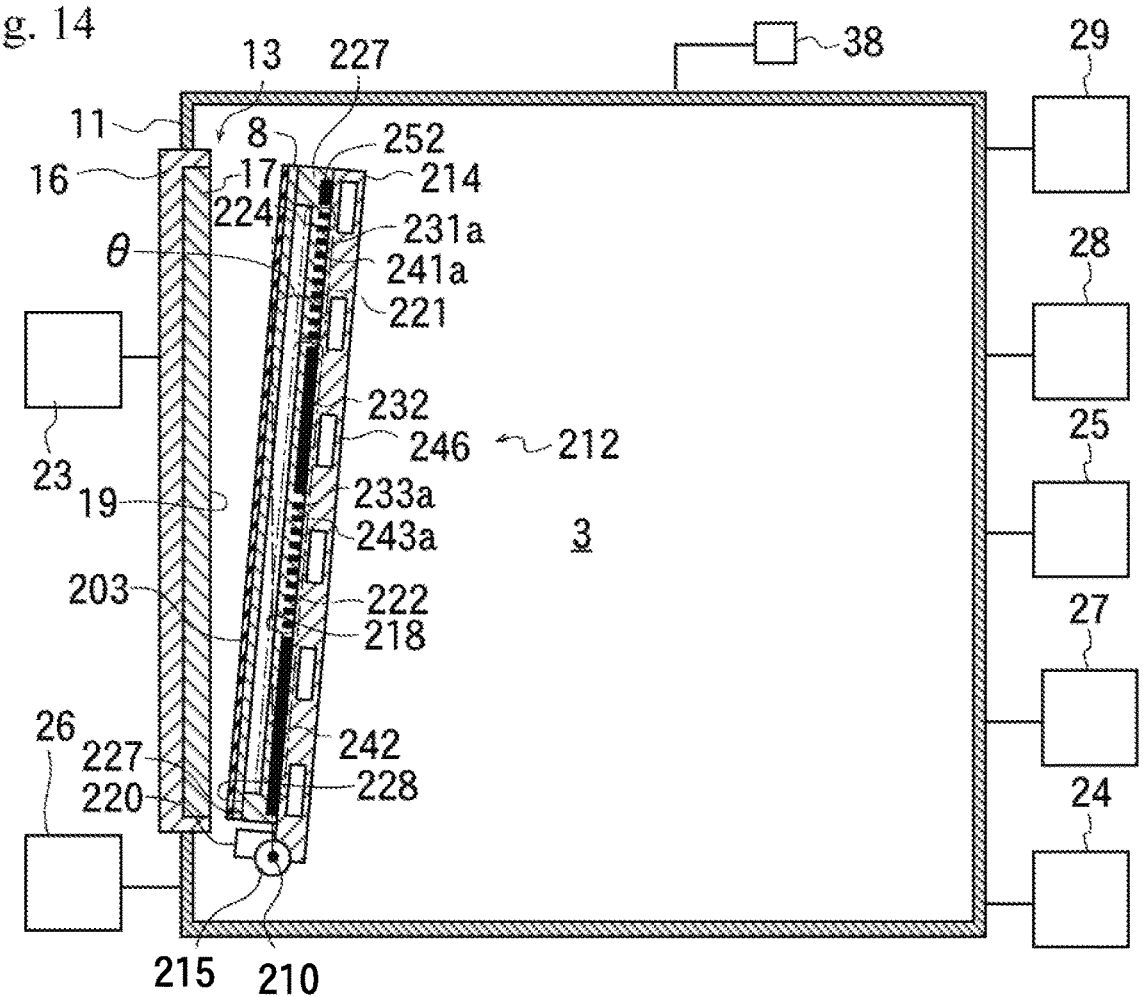
FIG. 14 is an explanatory diagram of the interior of the vacuum apparatus of the second example including the attraction apparatus of the second example placed in a stand posture that attracts an object to be attracted having a conductive thin film growing thereon.

The reference numeral 203 of FIG. 14 indicates the conductive thin film.

When the film thickness of the growing conductive thin film 203 increases in a state where the first attraction voltage and the third attraction voltage are respectively being applied to the first and the third positive and negative electrodes 231a, 231b, 233a, 233b, 241a, 241b, 243a and 243b, and gradient force has been generated, the gradient force decreases.

The film thickness of the growing conductive thin film 203 is being measured by a film thickness sensor and, upon detecting that the conductive thin film 203 has grown into a predetermined film thickness, the second attraction voltage is applied between the second positive and negative electrodes 232 and 242, a voltage of a same value as the voltage of either the second positive and negative electrodes 232 or 242 is applied to the auxiliary electrode 262 and, additionally, a voltage of a value having the same voltage of either the second positive and negative electrodes 232 or 242 is applied to the annular electrode 252.

Here, the second positive electrode 232 and the auxiliary electrode 262 have a same positive voltage applied thereto, and the second negative electrode 242 and the annular electrode 252 have a same negative voltage applied thereto, and the voltage of the second positive electrode 232 and the auxiliary electrode 262 relative to the second negative electrode 242 and the annular electrode 252 is the second attraction voltage.

It is also conceivable to preliminarily obtain the relationship between the magnitude of electric power to be supplied to the sputtering target 17 and the growth speed of the conductive thin film 203 and thus, the film thickness of the conductive thin film 203 from the sputtering time can be obtained.

The electrostatic force is weak when the film thickness of the conductive thin film 203 is thin immediately after starting growth, however, due to the increase of the film thickness of the conductive film 203, the attraction force generated by the second positive and negative electrodes 232 and 242, the auxiliary electrode 262, the ring-shaped electrode 252, and the conductive thin film 203 becomes equal to or exceeds the gradient force generated by the first and the third positive and negative electrodes 231a, 231b, 233a, 233b, 241a, 241b, 243a and 243b, so that it is possible to maintain attraction force of the object to be attracted 8 by electrostatic force even in a case where application of voltage to the first and the third positive and negative electrodes 231a, 231b, 233a, 233b, 241a, 241b, 243a and 243b is terminated, or the voltage being applied to the first and the third positive and negative electrodes 231a, 231b, 233a, 233b, 241a, 241b, 243a and 243b is reduced to cause the gradient force to disappear.

Because the first and the third attraction voltages are high voltages, the withstand voltage between the first and the third positive and negative electrodes 231a, 231b, 233a, 233b, 241a, 241b, 243a and 243b decrease, whereby abnormal electrical discharge may occur when heat medium gas is introduced into the gas groove 226 in a state where the first and the third attraction voltages are being applied between the first and the third positive and negative electrodes 231a, 231b, 233a, 233b, 241a, 241b, 243a and 243b.

Therefore, introduction of heat medium gas is started after the magnitude of the voltage applied between the first and the third positive and negative electrodes 231a, 231b, 233a, 233b, 241a, 241b, 243a and 243b are reduced to a value that prevents occurrence of abnormal electrical discharge. Reduction in the voltage means to be small the absolute value of the voltage.

Note that application of the second attraction voltage between the second positive and negative electrodes 232 and 242, the auxiliary electrode 262, and the annular electrode 252 may be started before the conductive thin film 203 grows into a predetermined film thickness, or the growth starts.

In addition, when reducing the voltage applied to the first and the third positive and negative electrodes 231a, 231b, 233a, 233b, 241a, 241b, 243a and 243b, the second attraction voltages may be applied between the first positive and negative electrodes 231a, 231b, 241a and 241b, and the third positive and negative electrodes 233a, 233b, 243a and 243b so as to generate electrostatic force between the growing conductive thin film 203 and the first and the third positive and negative electrodes 231a, 231b, 233a, 233b, 241a, 241b, 243a and 243b.

The object to be attracted 8 is attracted by electrostatic force having stronger attraction force than the attraction force of the gradient force, and heat medium gas is introduced between the object to be attracted 8 and the attraction apparatus 212. A detection device 38 for detecting the pressure of heat medium gas is provided in the vacuum chamber 11, and when heat medium gas is introduced, the detection device 38 first detects the pressure of heat medium gas inside the vacuum chamber 11.

In a case where the value of the detected pressure is larger than a predetermined reference value, attraction by electrostatic force is regarded as insufficient, the object to be attracted 8 is temporarily turned in a lying posture together with the attraction apparatus 212 while being kept attracted by the gradient force, and then, the object to be attracted 8 is removed from the attraction apparatus 212. The object to be attracted 8 is placed again after the attraction failure such as alien substance having been removed. Subsequently, the object to be attracted 8 is attracted again by the gradient force, then, placed in a stand posture.

When the detection result is normal, the thermal conductivity between the object to be attracted 8 and the attraction apparatus 212 increases, and therefore the process proceeds to the next step.

Because the type of the heat medium gas is known, measuring the partial pressure of the gas of the type of the heat medium gas when detecting the pressure inside the vacuum chamber 11 improves the sensitivity (S/N ratio), so that it is desirable. Furthermore, inside the vacuum chamber 11, the effect of the amount of leaking heat medium gas to the vacuum processing performed inside the vacuum chamber 11 is small, so that replacing the pressure inside the vacuum chamber 11 by measuring the pressure of the space between the object to be attracted 8 and the attraction apparatus 212 (any of the locations in communication with the space blocked by the object to be attracted 8 and the annular electrode 252) which is a small-volume part, improves the sensitivity (S/N ratio), and it is further desirable.

In addition, it is also possible to supply heat medium gas with a constant pressure and measure its flow amount, and when the amount of heat medium gas leaking inside the vacuum chamber 11 is determined large, it can be decided that attraction is failure, because it is determined that the measured value is larger than a predetermined value. To summarize, it suffices to measure, indirectly or directly, the amount of heat medium gas leaking inside the vacuum chamber 11 and determine that there is attraction failure when the amount of leakage is determined to be large.

A circulation path 246 is provided inside the attraction plate 214 of the attraction apparatus 212, the circulation path 246 is connected to a temperature adjusting device 29 provided outside the vacuum chamber 11.

A temperature-adjusted heat medium liquid is supplied to the circulation path 246 from the temperature adjusting device 29, the heat medium liquid flow through the circulation path 246 inside the attraction plate 214 so as to exchange heat with the attraction plate 214.

Here, the temperature adjusting device 29 is a cooling device which supplies cooled heat medium liquid to the circulation path 246, the heat medium liquid flows through the circulation path 246 inside the attraction plate 214, and exchanging heat with the attraction plate 214 so as to cool the attraction plate 214. The heat medium liquid of which temperature is raised returns to the temperature adjusting device 29 to cool, and is supplied to the attraction apparatus 212.

As thus discussed, the heat medium liquid cools the object to be attracted 8 by cooling the attraction apparatus 212, and the heat medium liquid repeatedly flows through the circulation path 246 of the attraction plate 214 so as to cool the object to be attracted 8 attracted onto the attraction apparatus 212.

The temperature adjusting device 29, which is also a heating device for heating the heat medium liquid, in the present embodiment, also a case where raising the temperature of the object to be attracted 8 is included.

It is also conceivable to provide a pipe on a surface opposite to the attraction surface 218 of the attraction plate 214, so as to flow the heat medium liquid inside the pipe serving as the circulation path 246.

As discussed above, it is confirmed that the object to be attracted 8 attracted onto the attraction apparatus 212 by electrostatic force is temperature controlled by heat medium gas and heat medium liquid, so that the object to be attracted 8 is held at a desired temperature during growth of the conductive thin film 203, and in a case where the object to be attracted 8 is cooled, for example, it is possible to grow the conductive thin film 203 without degrading the thin film or electrical elements or the like provided on the object to be attracted 8.

The upper end of the ring-shaped ridge 227 is located higher than the upper end of the support protrusion 225, the back surface of the object to be attracted 8 is in contact with the ring-shaped ridge 227, the object to be attracted 8 being pressed against the upper end of the ring-shaped ridge 227 by electrostatic force of the annular electrode 252, and the object to be attracted 8 and the ring-shaped ridge 227 being in close contact so as to bring about an almost airtight state, it has become difficult for the heat medium gas introduced from the gas-introducing hole 238 into the space surrounded by the ring-shaped ridge 227 to flow outside of the ring-shaped ridge 227. The difference between the height of the support protrusion 225 and the height of the ring-shaped ridge 227 is small, so that the back surface of the object to be attracted 8 comes into contact with the support protrusion 225.

In the attraction apparatus 212 discussed above, the auxiliary electrode 262 is provided in the first region 221, and because the upper part of the object to be attracted 8 is attracted by electrostatic force generated between the auxiliary electrode 262 and the conductive thin film 203, and electrostatic force generated between the annular electrode 252 and the conductive thin film 203, even when the gradient force generated by the first positive and negative electrodes 231*a*, 241*a*, 231*b* and 241*b* disappears, the upper part will not dangle in the absence of the gradient force, and there will be no floating due to a buckling phenomenon.

In addition, when the attraction force being applied to the object to be attracted 8 switches from the electrostatic force to the gradient force, there is a time period during which the attraction forces of both the electrostatic force and the gradient force are applied to the object to be attracted 8.

With the electrodes being arranged symmetrically about the centerline of the object to be attracted 8, neither rotational force due to the non-uniformity of the electrostatic force and the gradient force, or rotational force due to the resultant of the attraction and the weight of the object to be attracted 8 will not occur, so that no displacement will occur due to the rotational force, during the time period of which both attraction forces are being applied.

Furthermore, in the attraction apparatus 212, the third positive and negative electrodes 233*a*, 233*b*, 243*a* and 243*b* are provided in the second region 222, and the part facing the second region 222 of the object to be attracted 8 is attracted by gradient force, the part of the second region 222 of the object to be attracted 8 being intended to be attracted onto the attraction apparatus 212 by gradient force before occurrence of attraction force due to electrostatic force, so that the object to be attracted 8 will not displace from the attraction apparatus 212 when turned to a stand posture.

Figure 18A:
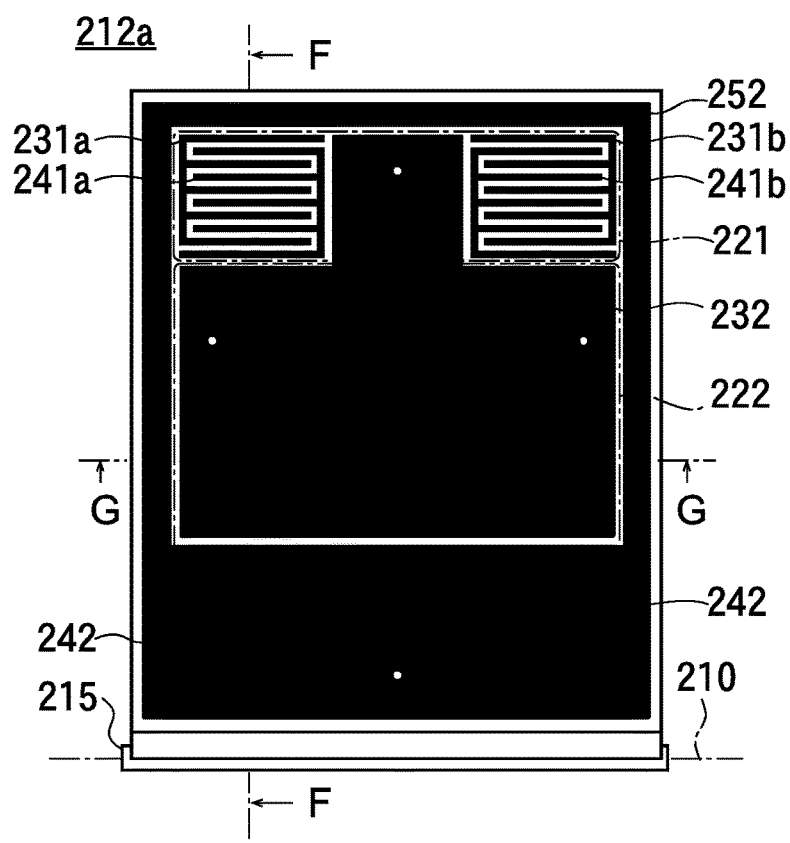
FIG. 18A is a plan view showing an electrode of an attraction apparatus having an auxiliary electrode and an annular electrode but not having third positive and negative electrodes.
Figure 18B:
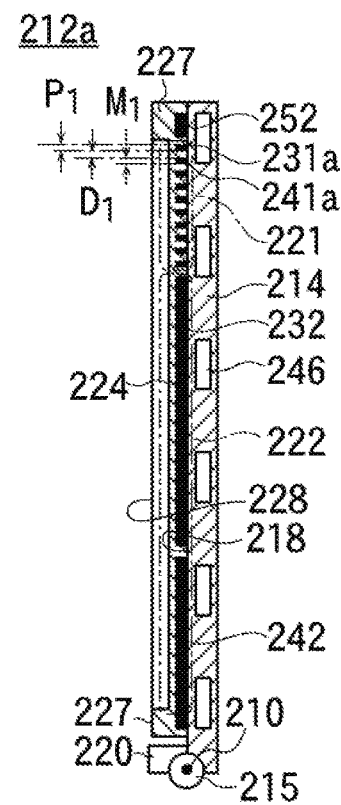
FIG. 18B is a cross-sectional view taken along line F-F of FIG. 18A.
Figure 18C:
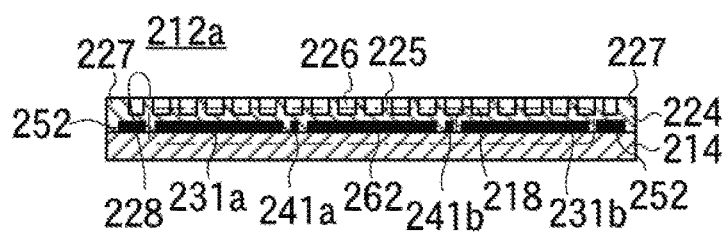
FIG. 18C is a cross-sectional view taken along line G-G of FIG. 18A.

However, in a case where the gradient force of the first positive and negative electrodes 231*a*, 231*b*, 241*a* and 241*b* is strengthened by providing a larger number of comb-like shapes, for example, it is not necessary to provide the third positive and negative electrodes in the second region 222, as the attraction apparatus 212*a* of FIG. 18.

Note that the planar electrodes of FIGS. 7 and 8 may also be used for the first and the third positive and negative electrodes of the attraction apparatus of the second example.

In addition, the auxiliary electrode 262 and the second positive electrode 232 are brought into contact with each other, and positive voltages of a same value are applied to the auxiliary electrode 262 and the second positive electrode 232 in the attraction apparatus 212 of the second example, however, it is also conceivable to apply a negative voltage to the electrode bearing the reference numeral 232 and the auxiliary electrode 262 of FIG. 15A, and apply a positive voltage to the electrode bearing the reference numeral 242 and the annular electrode 252 so as to generate electrostatic force.

In addition, it is also possible to separate the auxiliary electrode 262 and the electrode bearing the reference numeral 232, and apply voltages of different polarities to the auxiliary electrode 262 and the electrode bearing the reference numeral 232.

Moreover, although the attraction apparatus 212 of the second example is configured such that the annular electrode 252 and the second negative electrode 242 are brought into contact with each other, and voltages of a same value are applied to the annular electrode 252 and the second negative electrode 242, however, it is also possible to separate the annular electrode 252 and the electrode bearing the reference numeral 242 (second negative electrode), and apply voltages of different values or different polarities to the annular electrode 252 and the electrode bearing the reference numeral 242, as the attraction apparatus 212b of FIGS. 19A to 19C.

Note that, with regard to the first positive and negative electrodes 231a, 231b, 241a and 241b, and the third positive and negative electrodes 233a, 233b, 243a and 243, it is desirable a smaller difference between the area size of the electrodes to which a positive voltage is applied and the area size of the electrodes to which a negative voltage is applied are more desirable.

In addition, although a voltage of a same value as the voltage applied to the second positive electrode 232 or the second negative electrode 242 is applied to the annular electrode 252, and a voltage of a same value as the voltage applied to the second positive electrode 232 or the second negative electrode 242 is applied to the auxiliary electrode 262, the polarities of the voltages of the annular electrode 252 and the auxiliary electrode 262 may or may not be the same. However, a smaller difference between the area size of the electrode to which a positive voltage is applied and the area size of the electrode to which a negative voltage is applied is more desirable also among the second positive and negative electrodes 232 and 242, the auxiliary electrode 262, and the annular electrode 252.

What is claimed is:

1. A method of manufacturing a conductive thin film, the method comprising:
arranging, in a vacuum environment, a dielectric object to be attracted on an attraction apparatus in a lying posture;
applying a first attraction voltage that generates gradient force between a first positive electrode and a first negative electrode provided in a first region of an attraction plate of the attraction apparatus;
rotating the attraction apparatus while attracting the dielectric object so as to place the dielectric object and the attraction apparatus together in a stand posture;
applying a second attraction voltage that generates electrostatic force between a second positive electrode and a second negative electrode provided in a second region located below the first region, and during applying the second attraction voltage to the second positive electrode and the second negative electrode, terminating the first attraction voltage applied to the first positive electrode and the first negative electrode; and
growing a conductive thin film on a surface of the dielectric object via attraction of the attraction apparatus.

2. The method according to claim 1, further comprising:
when the attraction apparatus and the object are in the stand posture, applying, between the first positive electrode and the first negative electrode of the attraction apparatus, the second attraction voltage that generates the electrostatic force between the conductive thin film and the second positive electrode and between the conductive thin film and the second negative electrode;
attracting the conductive thin film by the second positive electrode and the second negative electrode; and
subsequently terminating the voltage applied between the first positive electrode and the first negative electrode.

3. The method according to claim 2, further comprising:
after terminating the voltage applied between the first positive electrode and the first negative electrode,
introducing, between the object and the attraction apparatus respectively placed in the stand posture, heat medium gas from a gas-introducing hole of the attraction apparatus; and
detecting the heat medium gas in the vacuum environment.

4. The method according to claim 3, further comprising:
when the object is placed in the stand posture, sputtering a sputtering target facing the object so as to grow the conductive thin film.

5. The method according to claim 4, further comprising, after starting the introduction of the heat medium gas from the gas-introducing hole, setting electric power supplied to the sputtering target to be larger than electric power supplied to the sputtering target before starting the introduction of the heat medium gas from the gas-introducing hole.

6. The method according to claim 3, further comprising:
applying a voltage of a same value as of the voltage applied to either the second positive electrode or the second negative electrode to an annular electrode surrounding the first positive electrode, the first negative electrode, the second positive electrode, and the second negative electrode;
attracting the conductive thin film by the annular electrode via electrostatic force; and
introducing the heat medium gas from the gas-introducing hole, the gas-introducing hole being provided in a region surrounded by a ring-shaped ridge of the annular electrode, while pressing the object against the ring-shaped ridge.

7. The method according to claim 6, further comprising:
applying the first attraction voltage between a third positive electrode and a third negative electrode provided in the second region, when applying the first attraction voltage between the first positive electrode and the first negative electrode.

8. The method according to claim 6, further comprising:
applying the second attraction voltage between an auxiliary electrode provided in the first region, and either the second positive electrode or the second negative electrode, when applying the second attraction voltage to the second positive electrode and the second negative electrode.

* * * * *